(12) United States Patent
Hunt

(10) Patent No.: US 6,944,803 B2
(45) Date of Patent: Sep. 13, 2005

(54) CODE STRUCTURE, ENCODER, ENCODING METHOD, AND ASSOCIATED DECODER AND DECODING METHOD AND ITERATIVELY DECODABLE CODE STRUCTURE, ENCODER, ENCODING METHOD, AND ASSOCIATED ITERATIVE DECODER AND ITERATIVE DECODING METHOD

(75) Inventor: Andrew William Hunt, Ottawa (CA)

(73) Assignee: Her Majesty the Queen in right of Canada, as represented by the Minister of Industry through the Communications Research Centre Canada, Ottawa, Ontario (CA)

( * ) Notice: Subject to any disclaimer, the term of this patent is extended or adjusted under 35 U.S.C. 154(b) by 780 days.

(21) Appl. No.: 09/899,150

(22) Filed: Jul. 6, 2001

(65) Prior Publication Data

US 2002/0016943 A1 Feb. 7, 2002

Related U.S. Application Data

(60) Provisional application No. 60/216,541, filed on Jul. 6, 2000.

(51) Int. Cl.[7] ................. H03M 13/13; H03M 13/29; H03M 13/45
(52) U.S. Cl. ................ 714/701; 714/755; 714/780; 714/786
(58) Field of Search .................. 714/701, 755, 714/780, 786

(56) References Cited

U.S. PATENT DOCUMENTS

| | | | | |
|---|---|---|---|---|
| 3,699,516 A | * | 10/1972 | Mecklenburg | 714/788 |
| 5,446,747 A | | 8/1995 | Berrou | 714/788 |
| 5,761,248 A | * | 6/1998 | Hagenauer et al. | 375/340 |
| 5,983,383 A | * | 11/1999 | Wolf | 714/755 |
| 6,023,783 A | | 2/2000 | Divsalar et al. | 714/792 |
| 6,145,114 A | | 11/2000 | Crozier et al. | 714/794 |
| 6,182,261 B1 | * | 1/2001 | Haller et al. | 714/758 |
| 6,332,209 B1 | * | 12/2001 | Eroz et al. | 714/790 |
| 6,437,714 B1 | * | 8/2002 | Kim et al. | 341/81 |
| 6,453,442 B1 | * | 9/2002 | Sadjadpour et al. | 714/787 |
| 6,530,059 B1 | * | 3/2003 | Crozier et al. | 714/786 |
| 6,570,927 B1 | * | 5/2003 | Van Stralen et al. | 375/242 |

FOREIGN PATENT DOCUMENTS

| | | | | |
|---|---|---|---|---|
| DE | 1950987 A1 | * | 12/1996 | |
| WO | 9738495 | | 4/1997 | ......... H03M/13/12 |
| WO | 0159935 | | 2/2001 | ......... H03M/13/29 |
| WO | 0198887 | | 6/2001 | ............ G06F/7/60 |

OTHER PUBLICATIONS

Benedetto, S., et al., "Unveiling Turbo Codes: Some Results on Parallel Concatenated Coding Schemes", IEEE Transactions on Information Theory, vol. 42, No. 2, Mar. 1996, pp. 409–428.*

(Continued)

Primary Examiner—Stephen M. Baker

(57) ABSTRACT

A class of codes and associated methods and devices are provided. Advantageously, such codes when used as constituent codes in composite codes intended for iterative decoding, as compared to the standard practice of using convolutional codes, may allow better error-correcting performance to be achieved, especially at low error rates and high code rates, for a given decoder complexity. State sequencing in these codes is driven not by source data alone, as is the case with convolutional codes, but rather by a sequence that includes both the source data and so-called "inserted" data elements, the inserted data elements having a linear dependence on the state sequencing state. In decoding, state transition intervals involving one or more inserted data elements are handled in a special way.

32 Claims, 13 Drawing Sheets

OTHER PUBLICATIONS

Sklar, B., "A Primer on Turbo Code Concepts", IEEE Comunications Magazine, Dec. 1997, pp. 94–102.*

Benedetto, S., "Analysis, Design, and Iterative Decoding of Double Serially Concatenated Codes with Interleavers", IEEE Journal on Selected Areas in Communications, vol. 16, No. 2, Feb. 1998, pp. 231–244.*

"Serial Concatenation of Interleaved Codes: Performance Analysis, Design, and Iterative Decoding", S. Benedetto et al., TDA Progress Report 42–126, Aug. 15, 1996, pp. 1 to 26.

"Trellis–Constrained Codes", B.J. Frey et al., (1998) In *Proceedings of the 35$^{th}$ Allerton Conference on Communication, Control and Computing* 1997, pp. 1 to 10.

"Near Shannon Limit Error—Correcting Coding and Decoding: Turbo–Codes (1)", Claude Berrou et al., 1993 IEEE, pp. 1064 to 1070.

"Low–Density Parity–Check Codes", R.G. Gallager, IRE Transactions on Information Theory, pp. 21 to 28.

"Near Optimum Error Correcting Coding and Decoding: Turbo–Codes", Claude Berrou, 1996 IEEE, pp. 1261 to 1271.

"Iterative Decoding of Binary Block and Convolutional Codes", Joachim Hagenauer, IEEE Transactions on Information Theory, vol. 42, No. 2, Mar. 1996, pp. 429 to 445.

"Optimal and Sub–Optimal Maximum a Posteriori Algorithms Suitable for Turbo Decoding", Patrick Robertson et al., Communication Theory, vol. 8, No. 2, Mar.–Apr. 1997, pp. 119 to 125.

"Separable Map "Filters" For the Decoding Of Product And Concatenated Codes", J. Lodge et al., 1993 IEEE, pp. 1740 to 1745.

ICC'93+Geneva, IEEE International Conference on Communications 1993, May 23–26, 1993, Geneva, Switzerland, Technical Program, Conference Record, vol. 3/3, IEEE Transactions on Information Theory, Mar. 1974, pp. 284 to 287.

"Turbo Decoding as an Instance of Pearl's "Belief Propagation" Algorithm", Robert J. McEliece et al., IEEE Journal on Selected Areas In Communications, vol. 16, No. 2, Feb. 1998, pp. 140 to 152.

* cited by examiner

CODE STRUCTURE, ENCODER, ENCODING METHOD, AND ASSOCIATED DECODER AND DECODING METHOD AND ITERATIVELY DECODABLE CODE STRUCTURE, ENCODER, ENCODING METHOD, AND ASSOCIATED ITERATIVE DECODER AND ITERATIVE DECODING METHOD

RELATED APPPLICATIONS

This application claims the benefit of Provisional Application No. 60/216,541 filed Jul. 6, 2000.

FIELD OF THE INVENTION

The invention relates to code structures, encoders and encoding methods for producing such codes, and to the associated decoding methods and decoders. Further, the invention relates to composite code structures, encoders and encoding methods for producing such composite codes, and to associated iterative decoding methods and decoders.

BACKGROUND OF THE INVENTION

A way of constructing error-correcting codes that are both powerful and can be efficiently decoded is to combine two or more smaller codes, called constituent codes, to form a larger composite code, with the decoding of the larger composite code being accomplished in an iterative manner using soft-in soft-out (SISO) decoding of the smaller constituent codes. The complexity of decoding a composite code is directly related to the complexity of SISO decoding the constituent codes. Single-parity-check (SPC) codes are amenable to low-complexity SISO processing because of their simple structure, and as a result, SPC codes are commonly used as constituent codes in composite code designs. The other type of code commonly used in composite code designs is convolutional codes. The regular trellis structure of convolutional codes results in SISO processing implementations of moderate complexity, provided that the number of states is small (e.g., 8 states). Various adjectives are used in this document to described data elements that are shared between constituent codes of a composite code, including "shared", "overlapped", and "interlocked".

Parallel concatenation of convolutional codes (PCCC) is a powerful type of code structure introduced in 1993 in: C. Berrou, A. Glavieux, and P. Thitimajshima, "Near Shannon Limit Error-Correcting Coding and Decoding: Turbo-Codes", in Proceedings, ICC '93, Geneva, Switzerland, May 1993, pp. 1064–1070. This paper is incorporated herein by reference. PCCC codes are commonly referred to as "Turbo codes". A PCCC code consists of two or more (usually recursive) systematic convolutional codes that overlap in their systematic portion, with the overlapping data elements having different orderings for each convolutional code. PCCC codes are particularly well-suited to lower code rate applications (e.g., r=⅓) and modest error-rate requirements (e.g., bit-error-rate BER above 10^-6), and can offer excellent performance for these types of applications.

There is no code structure to the interleaved data elements of a Turbo code. A Turbo code is a parallel arrangement of two or more systematic convolutional codes, where the constituent codes overlap in their systematic (i.e., source) portion only (hence, "parallel"). That is, with Turbo codes, only the information bits (or, in general, "information data elements") are interleaved. Thus, there is no code structure to the interleaved bits of a Turbo code, considered in isolation—they are simply information bits, and could be anything. (Note that there may be a tiny amount of code structure to the interleaved data elements of a Turbo code due to "trellis termination", but this level of structure does not provide any useful level of error-correction capability, and so can be ignored.)

A fundamental attribute of a PCCC code structure is that, for each of the convolutional codes that overlap, error event span can be increased indefinitely without an associated increase in interlocked (interleaved) weight. As error event span increases, total weight increases, but interlocked weight does not necessarily increase. In essence, with PCCC composite codes, interlocked weight is not coupled to event span for any of the constituent codes. This fundamental attribute of PCCC codes adversely affects their error-correcting performance at low error rates, with the problem being more pronounced the higher the code rate and/or the fewer the number of states.

Another type of composite code structure using convolutional codes was proposed in: S. Benedetto, G. Montorsi, D. Divsalar, and F. Pollara, "Serial concatenation of interleaved codes: Performance analysis, design, and iterative decoding", JPL TDA Progress Report, vol 42–126, August 1996. This report is incorporated herein by reference. The authors proposed serial concatenation of convolutional codes (SCCC). SCCC codes, like PCCC codes, consist of overlapping convolutional codes, but with SCCC, all of the (unpunctured) coded data elements of one convolutional code are provided as information data elements to a second convolutional code, with the second code being systematic and recursive. A disadvantage of SCCC, however, is that decoder hardware complexity is roughly doubled, on a per-state basis, as compared to PCCC. This is a direct consequence of the fact that with the first constituent code of an SCCC code, there are many state transition intervals where more than one data element is interleaved (or, more precisely, more data elements are interleaved than are necessary to determine the state transition). This means that in the iterative decoding of an SCCC code, soft-in soft-out processing needs to be able to provide soft outputs for not one but two data elements per state transition interval. As a result, non-local connectivity requirements, a dominant factor in implementation complexity, double. The fact that some state transition intervals have more than one interlocked (interleaved) data element is an inherent property of SCCC codes.

Turbo codes and SCCC codes both use convolutional codes as constituent codes to form a composite code structure. The regular trellis structure of convolutional codes makes moderate-complexity SISO decoder implementations possible, and this is why composite code designs for iterative decoding have focussed on covolutional codes as constituent codes (SPC codes are also used as constituent codes in LDPC codes (low density parity check codes). With convolutional constituent codes, however, there is an inevitable trade-off: either low-error rate performance is degraded, if only one data element per state transition interval is interlocked (interleaved), or decoder complexity is increased, if more than one data element per state transition interval is interlocked. That is, if only one data element per state transition is "overlapped", performance at low error-rates suffers. On the other hand, if two data elements per state transition are "overlapped", hardware decoder complexity is increased. This trade-off is inherent to the use of convolutional codes as constituent codes in composite code structures.

It would be highly advantageous to have a code for use as a constituent code in composite codes with which, with as few as a single interlocked data element per state transition interval, interlocked weight would rise with increasing event span, thus allowing better performance at low error rates without incurring a penalty in terms of hardware decoder complexity.

SUMMARY OF THE INVENTION

A class of codes, sometimes referred to herein as "injection codes" and associated methods and devices are provided. Advantageously, such codes when used as constituent codes in composite codes intended for iterative decoding, as compared to the standard practice of using convolutional codes, may allow better error-correcting performance to be achieved, especially at low error rates and high code rates, for a given decoder complexity.

A central feature of these codes is that state sequencing is driven not by source data alone, as is the case with convolutional codes, but rather by a sequence that includes both source data and so-called "inserted" data elements, the inserted data elements having a linear dependence on a state. In decoding, the consequence of the inserted data elements is that state transition intervals involving one or more inserted data elements are handled in a special way; not all state transitions of the state sequencing are in fact possible, and so for such intervals the decoding considers only a reduced subset of the entire set of state transitions.

One broad aspect of the invention provides an encoder adapted to encode a sequence of source data elements to produce a sequence of primary coded data elements, the encoder comprising a data organization component, a linear state sequencer and a state-to-data-elements converter. The data organization component is adapted to receive the sequence of source data elements and to receive a sequence of state-derived data elements from the state-to-data-elements converter and to output a data organization output sequence which includes every data element of the sequence of source data elements and which on an ongoing basis includes inserted data elements, each inserted data element inserted at a given time instant being either: i) one state-derived data element being output by the state-to-data elements converter at the given time instant or ii) a sum of one state-derived data element being output by the state-to-data elements converter at the given time instant and a linear combination of source data elements being output by the data organization component at the given time instant. The linear state sequencer is adapted to maintain a state consisting of state data elements and to perform linear state sequencing as a function of the data organization output sequence, which is provided as input to the linear state sequencer, and as a function of the state data elements. The state-to-data-elements converter is adapted to produce said sequence of state-derived data elements, wherein each state-derived data element is a linear combination of the state data elements. The sequence of primary coded data elements is equal to the data organization output sequence.

The linear state sequencer is configured to satisfy the following specifications:

a) if the linear state sequencer state is zero at a time i, any non-zero data organization output sequence data element at time i will result in a non-zero state at time i+1; and b) if the linear state sequencer state is zero at a time i, non-zero at time i+1, but again zero at a later time k>i+1, then necessarily there must be a non-zero data organization output sequence data element at some time j, with i<j<k.

The data organization component and the state-to-data-elements converter are configured in relation to the linear state sequencer to satisfy the following specifications:

c) if the linear state sequencer state is non-zero at a time x, non-zero at a later time z>x, and non-zero for all times between x and z, the time z cannot be advanced indefinitely, in so doing increasing the duration of the time interval [x,z] during which the linear state sequencer state is always non-zero, without necessitating a non-zero data organization output sequence data element at some time y, with x$\leq$y<z; and d) data element insertion by the data organization component into the sequence of source data elements to produce the data organization output sequence does not render any linear state sequencer state unreachable.

Preferably, the data organization component is adapted to insert inserted data elements on a periodic or pseudo-periodic basis.

Another embodiment of the invention provides an encoder as described above, further equipped with a re-ordering function adapted to produce a re-ordered version of the sequence of primary coded data elements, and a RSC (recursive systematic convolutional) encoder adapted to receive as input the re-ordered version of the sequence of primary coded data elements and to produce a sequence of coded data elements.

Another embodiment of the invention provides a composite code encoder adapted to encode a sequence of source data elements to produce a first sequence of primary coded data elements which satisfy a first set of constraints of a first code equivalent to the encoder described above, and which after being re-ordered to form a second sequence of coded data elements, satisfy a second set of constraints of another code, The second set of constraints might be those of another code type entirely such as an RSC code for example, of a code type consistent with the first code (i.e., another injection code, but not necessarily of exactly the same form as the first injection code), or identical to those of the first code.

More generally, a composite code encoder is provided which is adapted to encode a sequence of source data elements to produce a first sequence of primary coded data elements which satisfy a first set of constraints equivalent to the first code, and which are such that after being re-ordered to form a plurality of other sequences of coded data elements, with each primary coded data element of the first sequence occurring in at least one of the plurality of other sequences of coded data elements, each other sequence of coded data elements satisfies a respective set of constraints of another respective code.

Another embodiment provides an encoder adapted to encode a sequence of source data elements to produce a sequence of coded data elements, wherein a self-interlocking sequence that is an ordering of the coded data elements that includes each coded data element at least twice satisfies a set of constraints equivalent to those satisfied by the sequence of primary coded data elements.

While particular structures for encoders have been described, it is to be understood that, more generally, embodiments of the invention encompass any encoder adapted to implement a set of constraints equivalent to those of any of the encoders provided. For example, it would be possible to implement any of the above codes using a generator matrix structure, but the generator matrix structure would ultimately have to implement the same set of constraints.

In a preferred embodiment, the state sequencer is an N state sequencer with N=4, 8, 16 or 32 states. In another preferred embodiment, the encoder is further adapted to produce auxiliary coded data elements which are linear combinations of the state data elements and the primary coded data elements.

Another embodiment of the invention provides a method of generating an interleaver for use in the above introduced composite code encoder defining how the first sequence of primary coded data elements is re-ordered to form the second sequence of primary coded data elements. The method involves repeating the following steps until the entire interleaver is defined:

a) randomly generating a pair of indices which are not already included in the interleaver which will indicate where a random element of the first sequence of primary coded data elements will end up in the second sequence of primary coded data elements;

b) performing one or more performance tests, the performance tests taking into account that some linear state sequencer state transitions are not possible for state transition intervals involving inserted data elements;

c) if the performance tests pass, adding the pair of indices to the interleaver; and d) removing some indices previously added to the interleaver if no possible pair of indices which have not already been included in the interleaver passes the tests.

The invention, according to another broad aspect, provides an encoder adapted to encode a sequence of source data elements to produce a sequence of primary coded data elements, the encoder comprising a data insertion component and a linear state sequencer having state data elements. The data insertion component is adapted to receive the sequence of source data elements and to output the sequence of primary coded data elements which includes every data element of the sequence of source data elements and which on an ongoing basis includes inserted data elements, each inserted data element having a linear dependence on the state data elements. The linear state sequencer is adapted to perform linear state sequencing as a function of the sequence of primary coded data elements which is provided as input to the linear state sequencer and as a function of the state data elements. Inserted data element insertion by the data insertion component into the sequence of source data elements to produce the sequence of primary coded elements does not render unreachable any particular set of values for the state data elements of the linear state sequencer.

The invention, according to another broad aspect, provides a soft-in soft-out decoder adapted to perform soft-in soft-out decoding in a manner consistent with any one of the above introduced encoders of a first sequence of multi-valued probabilistic quantities to produce a second sequence of multi-valued probabilistic quantities, wherein the decoder is adapted to consider all linear state sequencer state transitions for state transition intervals without inserted data elements, and is adapted to consider for state transition intervals with inserted data elements only state transitions which are possible given that the inserted data elements have a predetermined dependency on the state.

Another embodiment of the invention provides an iterative decoder adapted to perform iterative decoding of a sequence of multi-valued probabilistic quantities to produce a sequence of decoded data elements, the iterative decoder including SISO decoding functionality as described above.

Another broad aspect of the invention provides a signal comprising a sequence of primary coded data elements of a first code embodied on a transmission medium or a storage medium containing every data element from a sequence of source data elements, the sequence of primary coded data elements also containing on an ongoing basis inserted data elements, the inserted data elements having a linear dependence upon a state, the state being determined by performing linear state sequencing as a function of the sequence of primary data elements which is provided as input to the linear state sequencing. The sequence of primary coded data elements satisfies specifications consistent with those introduced in respect of the any of the encoders introduced above.

In another embodiment, in the signal the sequence of primary coded data elements is further adapted to, after being reordered, satisfy a set of constraints imposed by a second code. The second set of constraints may be those of another code of a completely different type, similar type, or identical to those of the first code.

SISO decoders and iterative decoders are provided for decoding such signals.

The invention according to another broad aspect provides a method of stopping an iterative decoder decoding a composite code comprising at least two constituent codes, a partial iteration of the iterative decoder comprising performing SISO decoding of one of the constituent codes. The method involves checking three conditions as follows for each multiple instance data element:

a) after each partial iteration a change in an extrinsic associated with each instance of a data element, not including a next instance to undergo SISO processing, must not disagree with a decision associated with this same instance;

b) decisions must agree between all instances of a data element;

c) decisions must be unambiguous;

and when the three conditions are satisfied, stopping the iterative decoder from performing any further partial iterations.

The method might be adapted for example for application wherein the at least two constituent codes are exactly two constituent codes.

Embodiments of the invention also contemplate any of the above encoders or decoders or early stopping methods implemented as processing platform (application specific or general purpose) executable code stored on a processing platform readable medium. Furthermore, any of the above encoders or decoders or early stopping methods may be implemented with any suitable combination of hardware and/or software. This might for example include programmable logic, firmware, software etc. implementations of encoders/encoding and decoders/decoding.

BRIEF DESCRIPTION OF THE DRAWINGS

Embodiments of the invention will now be described in further detail with reference to the attached drawings in which:

FIGS. 6 and 7 are examples of matrices developed in the determination of an example parity check matrix for the code of FIG. 5;

FIG. 9 is a flowchart of a method of generating an interleaver for use with the composite code type of which FIG. 5 is an example;

FIG. 10 is a block diagram of an iterative decoder suitable for decoding the composite code type of which FIG. 5 is an example;

DETAILED DESCRIPTION OF THE PREFERRED EMBODIMENTS

An embodiment of the present invention provides a new type of code which is very suitable for use as a constituent code in a composite code structure. The code is highly amenable to soft-in soft-out processing, and hence appropriate for use in a composite code structure. For the purpose of this description, the new codes will be referred to as "injection codes". With injection codes (used in composite codes), interlocked weight is coupled to event span with as few as a single interlocked data element per state transition interval. For each state transition interval, only enough data elements necessary to determine the state transition need be interlocked. This means that excellent performance at low error rates can be achieved without incurring a penalty in terms of increased hardware decoder complexity.

Figure 1:
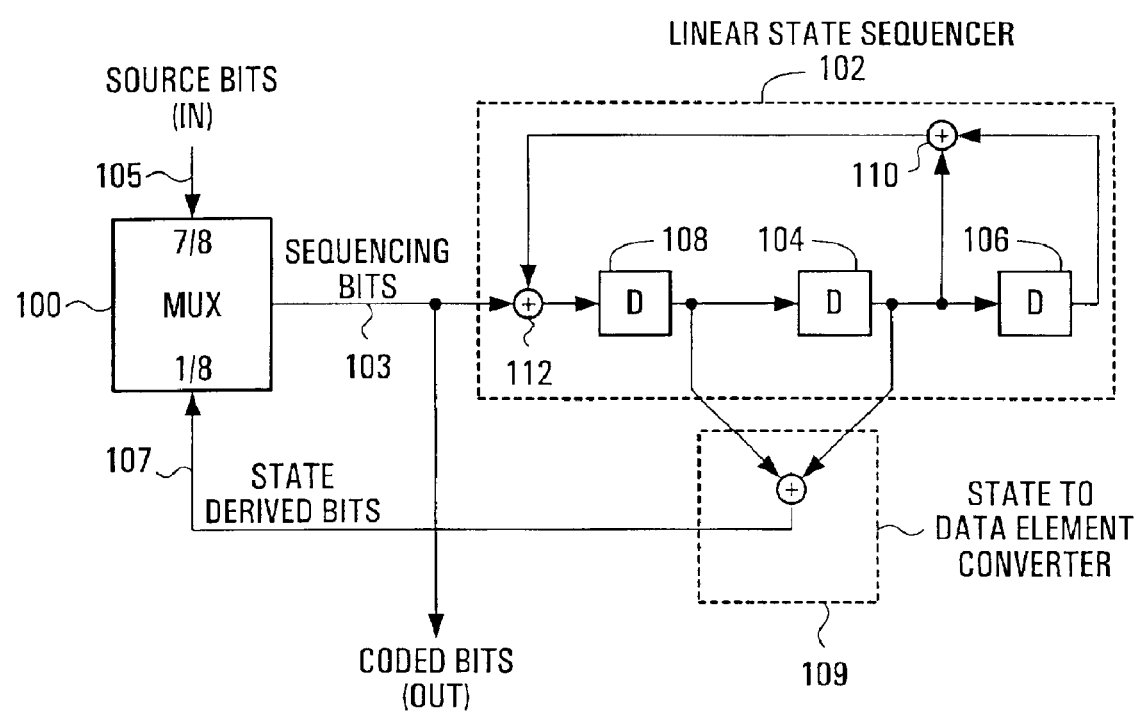
FIG. 1 is a block diagram of an injection code encoder provided by an embodiment of the invention.
Figure 3:
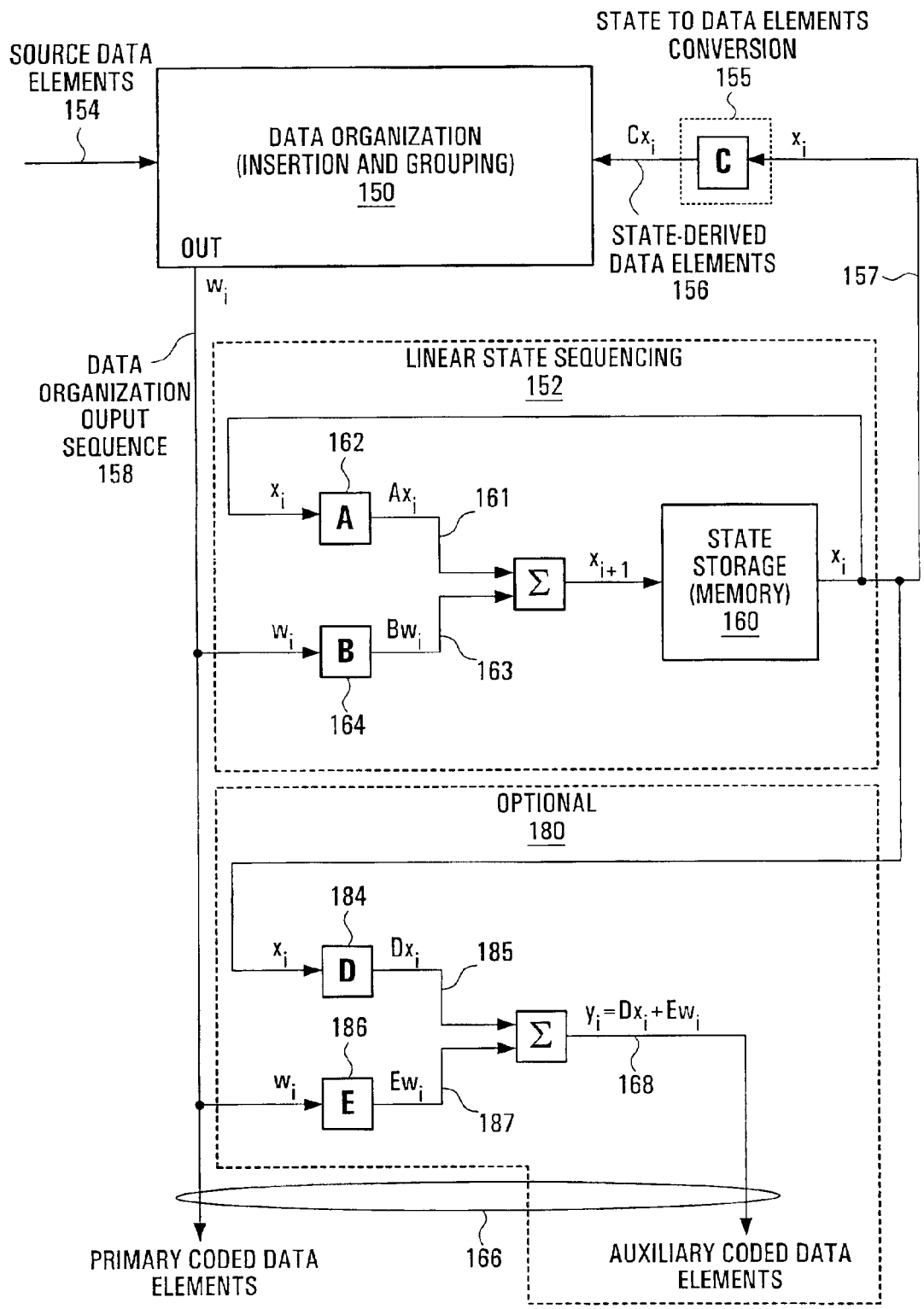
FIG. 3 is a block diagram of a generalized injection code encoder method.

Injection codes will be introduced first by way of example with reference to FIG. 1, and then with a more general description with reference to FIG. 3.

In FIG. 1, an injection code encoder is shown which has a multiplexer 100 and a linear state sequencer 102. The multiplexer produces a sequencing bit stream 103 which alternates between including seven consecutive bits of a source bit stream 105 and one bit of a state-derived bit stream 107 determined as a function of the state of the linear state sequencer 102 by a state-to-data element converter 109. The sequencing bit stream 103 is the input to the linear state sequencer 102 and also serves as the output of the injection code encoder. The linear state sequencer 102 has a state memory having three binary delay elements D1 108, D2 104, and D3 106 and thus having eight states. The linear state sequencer 102 is a binary, eight-state, maximal-length state sequencer. The linear state sequencer 102 is termed "maximal length" because once in a non-zero state, and given subsequent all-zero input, it will sequence through all possible non-zero states before repeating. The linear state sequencer 102 has a feedback path by which the contents of the second and third delay elements 104,106 are combined with an exclusive-or function 110 and the result of that combined at the input to the linear state sequencer 102 with the sequencing bit stream 103 with another exclusive-or function 112. It is important to note that the multiplexer 100 does not replace source bits 105 with inserted state derived bits; rather, the multiplexer 100 inserts state-derived bits into the source bit stream, producing a new data stream which is the sequencing bit stream 103.

It is noted that this is entirely different from a conventional convolutional encoder, where the state sequencer sees a source data stream directly. With a convolutional code, there is a correspondence between state transition intervals and source data elements. With the injection code provided herein, pre-determined state transition intervals do not correspond to source data elements, but rather correspond to data elements determined by the state of the linear state sequencer at the beginning of each interval.

Preferably, the state sequencer starts in the all-zeros state, and also ends in the all-zeros state. The mechanism by which the state sequencer returns to the all-zeros state is not shown in the example of FIG. 1. The provision of such a mechanism would be a straight-forward matter for one skilled in the error-correction coding field.

The injection code encoder of FIG. 1 has a number of characteristics which will become essential to the definition of an injection code. These characteristics will be introduced below in the context of a description of FIG. 3 which is a generalization of FIG. 1.

Injection Code Generalization

It is noted by way of introduction that injection codes are by no means necessarily binary; that is, the data elements involved need not be bits. Furthermore, there can be more than one sequencing data element per state transition interval. For example, FIG. 2 shows an example of how state sequencing could operate with two sequencing bits per state transition interval.

Figure 2:
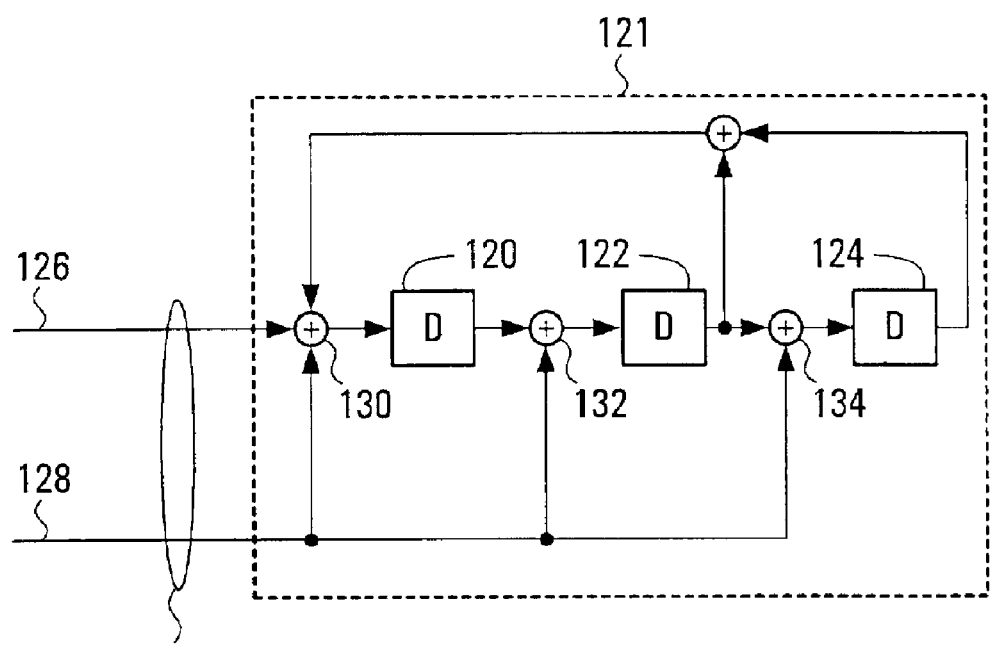
FIG. 2 is a block diagram of another state sequencer suitable for use in an injection code encoder.

FIG. 2 shows a state sequencer 121 with three binary delay elements 120,122,124 having the same feedback path as described with reference to FIG. 1, but having sequencing bits introduced to the state sequencer two at a time, with one 126 being introduced only at exclusive-or function 130, and with the other 128 being introduced at three exclusive-or functions 130,132,134. A state transition interval involves one cycle of the linear state sequencer 121, and in this case there are two bits introduced for each such cycle.

Also, the "memory" associated with linear state sequencing can be any number of data elements in size (i.e., there can be any number of so-called "state data elements"). Finally, additional coded data elements that do not drive the linear state sequencer can optionally be generated, these "auxiliary" coded data elements being generated as linear combinations of both the state data elements and the sequencing data elements. With an arbitrary data element type, an arbitrary number of sequencing data elements per state transition interval, an arbitrary number of state data elements, and optional auxiliary coded data elements, it becomes necessary to use matrix notation to depict injection code encoding. FIG. 3 is such a depiction of generalized injection code encoding.

Before proceeding to describe generalized injection code encoding, some notational conventions need to be established. Boldface lower-case letters represent vector quantities, and boldface upper-case letters represent matrix quantities. Note that a vector quantity may consist of one or more elements, and similarly, a matrix quantity may only consist of one or more rows and one or more columns. Subscripts are used to indicate time; for example, the notation $x_i$ represents the vector x at time "i".

The x vector is the state vector, and consists of state data elements. The number of states of the linear state sequencing is determined by the number of state data elements, and the number of possible values each state data element can have (i.e., the size of the finite field under consideration). Specifically, the number of states is calculated by raising the field size to the power of the number of state data elements. For example, if the data element type being considered is bits, each state data element can have two possible values (0 or 1), and if there are three state data elements, then the number of states is $2^3=8$ (as in FIG. 1). The terms "all-zeros state" and "zero state" are synonymous, and are used interchangeably to refer to the condition of each state data element having a value of zero (i.e., x=0). The intervals between time instants (this is a discrete-time system) are referred to as "state transition intervals"; for example, "i to i+1" is a state transition interval.

FIG. 3 may be thought of as a block diagram showing components of a generalized injection code encoder provided by an embodiment of the invention, or as steps of an encoding method provided by an embodiment of the invention, and provides a definition of a code having a new structure provided by an embodiment of the invention. It is noted that FIG. 3 does not provide the whole story of injection code generalization. An injection code is one having the structure of FIG. 3, but also preferably constrained by a number of "injection code specifications" presented in detail below. For the purpose of description at this point, FIG. 3 will be described from the point of view of an encoding method. The major steps include a data organization step generally indicated by 150, a linear state sequencing step generally indicated by 152, and a state-to-data-elements conversion step 155. The linear state sequencing step 152 will be described in detail further below, and for now it suffices to note that this step 152 maintains and outputs a state $x_i$ 157. The functionality of the data organization step 150 and the state-to-data elements conversion 155 may be collectively referred to as a data insertion step or component.

The data organization step 150 operates on a sequence of input source data elements 154 and a sequence of state-derived data elements $Cx_i$ 156 fed back from the linear state sequencing step 152 by the state-to-data-elements conversion step 155 to produce a data organization output sequence $w_i$ 158 which includes each and every source data element 154 and also includes "inserted" data elements. Each inserted data element has a linear dependence on the state $x_i$. The state $x_i$ maintained by the linear state sequencing step 152 is processed by a state-to-data-elements conversion step 155 to produce the sequence of state-derived data elements $Cx_i$ 156. A state-derived data element is an element determined as a linear combination of state data elements (i.e., elements of $x_i$), according to $Cx_i$, where C is a matrix representing one or more particular linear combinations. The data organization step 150 determines which state-derived data elements from $Cx_i$ are to be inserted into the data organization output sequence $w_i$ 158.

In embodiments where the data organization output sequence is multi-dimensional (more than one sequencing data element per state transition—that is, the $w_i$ vector has two or more elements) the data organization step 150 determines where in a given output $w_i$ the inserted data elements should go. The output at a given time may be only source data elements, only inserted data elements, or both source and one or more inserted data elements. When there are both source and inserted data elements, the inserted data elements may be linear combinations of the state derived data elements and the source data elements output in the same state transition interval. That is, if a $w_i$ consists of a mix of source data elements and inserted data elements, each inserted data element of said $w_i$ may not simply be a state-derived data element from $Cx_i$, but may also include a linear contribution from the associated source data elements (i.e., the source data elements of the $w_i$ being considered).

The state $x_i$ 157, the state-derived data elements $Cx_i$ 156, and the data organization output $w_i$ 158 are vectors, although it is of course to be understood that a vector can have one or more elements. In the event the data organization output sequence $w_i$ 158 is a vector of length greater than one, inserted data elements may occur in one or more of the vector's locations. In this discussion, phrases such as "the state-derived data elements $Cx_i$," are commonly used. $Cx_i$ is, strictly speaking, a vector of one or more data elements, not a data element itself, but such phrases are used for the sake of clarity. It is to be understood that phrases of the form "data elements <vector>" typically refer to the data elements of the vector quantities being considered.

In one embodiment, the insertions are periodic in nature. If $w_i$ and $Cx_i$ have length 1, then the data organization step effectively results in a multiplexing being performed between the source data elements and the state-derived data elements. In another embodiment, the insertions occur according to an insertion definition vector of some length which is repeated. For example, the positions of ones and zeros in an insertion definition vector (0000001000101000) might represent where in each subsequence of sixteen primary coded data elements are located source data elements and inserted data elements respectively. Elements from the state-derived data elements 156 which are not used in determining inserted data elements are discarded. In a more general sense, a vector can be used to define a unique set of insertion locations for the entire data organization output sequence 158.

Turning now to the state sequencing step 152, the output of the current state is represented by state storage 160. As indicated previously, a linear combination of state data elements ($Cx_i$) is fed back to the data organization step 150 described previously. The input to the state sequencing step is the data organization output $w_i$ 158. The state sequencing step 152 generates new states $x_{i+1}$ from previous states $x_i$ and the data organization outputs $w_i$ according to a linear combination $Bw_i$ 163 of the current data organization output $w_i$ plus a linear combination $Ax_i$ 161 of current state $x_i$. Preferably, the state sequencing operates with N=4,8,16 or 32 states, although other numbers of states may be employed. It is noted however that too many states may make it impractical to build a corresponding SISO decoder. SISO decoding of injection codes is discussed in detail below.

Also shown is an optional step generally indicated by 180 which will be referred to as an auxiliary coded data elements generation step. The input to the auxiliary coded data elements generation step 180 is the data organization output $w_i$ 158 and current state $x_i$ of the linear state sequencing step 152. Auxiliary coded data elements 168 are generated according to a linear combination $Ew_i$ 187 of the current data organization output $w_i$ plus a linear combination $Dx_i$ 185 of current state $x_i$. D 184 and E 186 are matrices which define the auxiliary coded data elements step 180 entirely.

Now the various matrices of FIG. 3 will be described in further detail. The A matrix 162 is the state sequencing state-to-state matrix. This matrix is a square matrix that determines the next state from the current state, given all-zero input. That is, if $w_i$=0, $x_{i+1}$=$Ax_i$. Referring to the example encoder of FIG. 1, if one adopts the convention that the first (left-most) delay element corresponds to the first element of the state vector, the middle delay element to the second state vector element, and the right-most delay element to the third state vector element, then the A matrix for this example would be as follows (the state vector is assumed to be a column vector):

$$\begin{bmatrix} 0 & 1 & 1 \\ 1 & 0 & 0 \\ 0 & 1 & 0 \end{bmatrix}$$

The B matrix is the state sequencing input matrix. If the state at some time i is zero, then the state at time i+1 is $Bw_i$. That is, if $x_i=0$, then $x_{i+1}=Bw_i$. Referring again to the example encoder of FIG. 1, and continuing to use the conventions stated in the previous paragraph, the B matrix for this example would be:

$$\begin{bmatrix} 1 \\ 0 \\ 0 \end{bmatrix}$$

Perhaps a more interesting case is the B matrix for the example state sequencing shown in FIG. 2, which has two sequencing bits per state transition interval. For this example, the B matrix is shown below. The first column corresponds to the upper state sequencing input bit 126, and the second column corresponds to the lower state sequencing input bit 128. The matrix is as follows:

$$\begin{bmatrix} 1 & 1 \\ 0 & 1 \\ 0 & 1 \end{bmatrix}$$

The C matrix is the state to data element conversion matrix. This matrix generates state-derived data elements (the elements of Cx) as linear combinations of the state data elements (the elements of x). The state-derived data elements are used in data element insertion. For the example of FIG. 1, the C matrix would be:

$$[1 \ 1 \ 0]$$

The D and E matrices 184,186 are optional, and are associated with auxiliary data element generation. These matrices, if used, generate auxiliary coded data elements as linear combinations of the state data elements (the elements of x) and the sequencing data elements (the elements of w). The example injection code of FIG. 1 does not have auxiliary coded data elements, and so there are no D and E matrices for this example.

The coded data elements of an injection code thus fall into two categories: data elements that drive the state sequencing, and data elements that do not. Those coded data elements that drive the state sequencing are termed "primary coded data elements", and those coded data elements not involved in state sequencing are termed "auxiliary coded data elements". Auxiliary coded data elements are entirely optional, and simply augment the fundamental code structure of the primary coded data elements. With all injection codes, whether or not they include auxiliary coded data elements, the primary coded data elements, considered on their own, always have an inherent code structure.

The term "primary coded data elements" is simply another name for the sequencing data elements that drive the linear state sequencing; that is, the primary coded data elements are exactly the same as the sequencing data elements. This different labeling, however, is more natural when discussing the coded data elements of an injection code: there are primary coded data elements, and, optionally, there are auxiliary coded data elements.

FIG. 3 shows both the primary coded data elements 158 and the auxiliary coded data elements 168 grouped into vectors (of course, the vectors may have only one element, as noted earlier). This grouping of coded data elements is intentionally retained because the grouping provides information about the associations between coded data elements and state transition intervals.

Data Organization—Further Notes

The "data organization" step 150 provides data element insertion functionality, as well as grouping functionality. If there is only one sequencing data element per state transition interval (i.e., w has only one element), the data organization step of injection code encoding simply amounts to a multiplexing operation, with a state-derived data element being inserted into the source data element stream 154 for each state-transition interval pre-determined to be a data element insertion interval. This is the case for the example encoder of FIG. 1. Data organization in this example simply amounts to inserting a state-derived bit after every seven source data bits, producing a sequencing data bit stream that drives the state sequencing.

If there is more than one sequencing data element per state transition interval (i.e., w has two or more elements—FIG. 2 shows an example of such state sequencing), but for every insertion interval, all of the sequencing data elements are inserted data elements, the situation is still fairly simple. In such cases, the data organization functionality amounts to either grouping source data elements into an input suitable for the state sequencing (i.e., grouping according to the number of elements of w), or passing the state-derived data elements Cx as the state-sequencing input w.

The situation can become somewhat more complicated when there is more than one sequencing data element per state transition interval, and insertion intervals involve a mix of both source data elements and inserted data elements. That is, there can be cases where, for state transition intervals involving data element insertion, not all of the elements of the state sequencing input vector w are inserted data elements—some are inserted data elements, and some are source data elements. In such cases, the data organization functionality may simply amount to appropriately grouping one or more source data elements together with one or more state-derived data elements into an input appropriate for state sequencing. In this scenario, the inserted data elements are simply state-derived data elements. There is another possible "mixed" scenario, however, that is somewhat more subtle in nature. In cases where data element insertion intervals involve a mix of both inserted data elements and source data elements, an inserted data element may in fact be the sum of a state-derived data element and a linear combination of "associated" source data elements, "associated source data elements" meaning those source data elements grouped into the same state sequencing input vector w as the inserted data element under consideration. All that is being said here is that in some cases, inserted data elements may not simply be state-derived data elements, but may also include a (linear) contribution from associated source data elements. Of course, if there is only one sequencing data element per state transition interval, inserted data elements cannot have any "associated" source data elements, and hence this subtlety does not apply; one simply has the "multiplexing" case discussed at the beginning of this section.

Injection Code Specifications

There are some specifications associated with injection code encoding beyond the general framework shown in FIG. 3 and described above. These specifications are as follows:

Injection Code Specification One: If in the zero state, the state sequencing will remain in the zero state unless disturbed from this state by some non-zero source data element or elements; that is, the encoder will not leave the zero state "on its own". This property follows directly from the linearity of the system.

Injection Code Specification Two: Any non-zero source data element or elements will cause a switch from the zero state to a non-zero state. This specification puts restrictions on the B matrix. In algebraic notation, this specification can be expressed as: $Bw \neq 0$ for all $w \neq 0$. Another way of saying this is that if the linear state sequencer state is zero at a time i, any non-zero data organization output sequence data element at time i will result in a non-zero state at time i+1.

Injection Code Specification Three: Having been perturbed from the zero state by some non-zero source data at time i, the state sequencing will not return to the zero state without at least one additional non-zero sequencing data element at some time j>i. That is, an encoding "event", which is a departure from, and subsequent return to, the zero state, requires non-zero sequencing data at two or more distinct time instants. Another way of saying this is that if the linear state sequencer state is zero at a time i, non-zero at time i+1, but again zero at a later time k>i+1, then necessarily there must be a non-zero data organization output sequence data element at some time j, with i<j<k. It is critical to recognize that though this specification is expressed with reference to the all-zeros state, the linearity of the system means that this specification affects system behavior for all states. This specification puts restrictions on both the A and B matrices, and how they relate to each other. Combining this specification with the previous specification gives, in algebraic notation: $A^m Bw \neq 0$ for all $w \neq 0$, and for all $m \geq 0$.

Injection Code Specification Four: Event span cannot be increased indefinitely without increasing the sequencing data element weight (the term "weight" refers to the number of non-zero data elements). Roughly speaking, this means "the longer the event, the larger the sequencing weight". Because of data element insertion, the state sequencing cannot remain in non-zero states indefinitely without an increase in sequencing weight. Note that the non-zero sequencing data elements between the start and end of a long encoder event are by no means necessarily inserted data elements—they may be inserted data elements, but they can also be source data elements, or a mix of source and inserted data elements. However, it is because of data element insertion that as the span of an event is increased, the sequencing weight must eventually also increase. Again, because of linearity, this specification affects system behavior for all states. Another way of saying this is that if the linear state sequencer state is non-zero at a time x, non-zero at a later time z>x, and non-zero for all times between x and z, the time z cannot be advanced indefinitely, in so doing increasing the duration of the time interval [x,z] during which the linear state sequencer state is always non-zero, without necessitating a non-zero data organization output sequence data element at some time y, with $x \leq y < z$.

Consider the injection code encoding depicted in FIG. 1, but suppose that the operation of the multiplexing was such that every 7th sequencing bit was an inserted bit, instead of every 8th. The state sequencing of this example has a period of 7, and so a data insertion period of 7 would exactly match the state sequencing period. With such a matching, there would be cases where event span could be increased indefinitely without increasing the sequencing weight, and so one would not have a legitimate injection code.

Injection Code Specification Five: Data element insertion does not render any states unreachable. That is, if state transition interval i to i+1 involves data element insertion (i.e., one or more data elements of $w_i$ are not source data elements, but rather are inserted data elements), any state value at time i+1 can still be reached from at least one state value at time i. Employing algebraic notation, this specification can be expressed as follows: "For any state $x_{i+1}$, there exists some $x_i$ such that $Ax_i + Bw_i = x_{i+1}$, whether or not $w_i$ includes one or more inserted data elements."

Referring to the example injection code encoder of FIG. 1, consider the situation if the "state-to-data-element conversion" not only tapped the first two delay elements of the state sequencing, but also tapped the third (final) delay element. If this were the case, it would be impossible to reach state 1-0-0 (reading the delay element values left-to-right) with a state transition interval involving data element insertion. Without data element insertion, state 1-0-0 can be reached from states 0-0-0 and 0-0-1 (depending on the value of the associated source data element). However, if the state-to-data-element conversion did tap the final delay element, for a state transition interval involving data element insertion, neither of these two states would lead to state 1-0-0. This would mean that state 1-0-0 had been made unreachable as a result of data element insertion, which is exactly what the specification being discussed asserts cannot be the case. That is, for the state sequencing of FIG. 1, the state to data element conversion cannot tap the final delay element. This leaves only 3 possible choices for state to data element conversion for the state sequencing of FIG. 1: i) tap only the first delay element, or ii) tap only the second delay element, or iii) tap both the first and second delay elements.

A direct consequence of this specification is that, for binary injection codes, the number of state data elements must be greater than one. This in turn means that the number of states of any injection code (binary or otherwise) is always greater than two.

The property of injection codes that data element insertion does not make any states unreachable is very significant from a hardware decoder complexity perspective. Injection code decoding is discussed later.

Injection Code Specification Six: The number of inserted data elements, relative to the total number of sequencing data elements, must not be insignificant. Data element insertion is central to injection coding, and having only one inserted data element for every thousand sequencing data elements, for example, would not constitute a legitimate injection code. What amounts to a reasonable fraction of inserted data elements depends on a variety of factors, but most notably on the number of states of the linear state sequencing. With 8-state binary state sequencing as in FIG. 1, inserted data elements will typically amount to 10% or more of the sequencing data elements. With more powerful state sequencing, however, the insertion percentage can be greatly reduced while still achieving highly effective injection code structures. This specification is actually related to specification four which requires an increase in sequencing weight as event span is increased.

More generally, the minimum number of inserted data elements is not a fixed value, but rather code performance at low error rates will degrade as the number of inserted data elements becomes too small.

It is important to remember that what is being considered here is the number of inserted data elements of a single injection code, not the total number of inserted data elements of a composite code (discussed below), which may involve more than one injection code, and hence have a much larger fraction of inserted data elements.

To summarize, there are specifications associated with general injection code encoding as depicted in FIG. 3:

Code is a linear code.

Any non-zero source data element or elements will cause a switch from the zero state to a non-zero state.

Having been perturbed from the zero state by some non-zero sequencing data, the state sequencing will not return to the zero state without one or more additional non-zero sequencing data elements.

Event span cannot be increased indefinitely without increasing the sequencing data element weight.

Data element insertion does not render any states unreachable.

A not-insignificant fraction of the sequencing data elements must be inserted data elements.

It is to be understood that in accordance with conventional practice, some procedure might be required to handle starting and ending states. These are not depicted in FIG. 1 or FIG. 3 as they are not specific to the invention. Standard approaches used with convolutional coding may be used, such as "flushing", where the starting and ending states are both the "all-zeros" state, and "tail-biting", where the starting and ending states are both the same. The term "trellis termination" is often used to refer to this issue of handling the starting and ending states.

The output 166 of the entire process includes a sequence of primary coded data elements which is identical to the data organization output 158, and thus also identical to the data elements provided at the input of the state sequencer. Optionally, auxiliary coded data elements 168, defined for a given time i to be $y_i = Dx_i + Ew_i$, may also be included in the output.

Injection Codes and Code Structures Suitable for Iterative Decoding

Injection codes were developed to be highly suitable for use in iteratively-decoded error-correction coding schemes. A wide variety of code structures suitable for iterative decoding can be constructed using injection codes. However, there is one fundamental attribute associated with the use of injection codes in code structures intended for iterative decoding that is common across all such code structures. This common attribute is that there are at least two instances of each primary injection code data element. That is, whenever an injection code is used in forming a code structure suitable for iterative decoding, each primary coded data element will appear at least twice in the overall code structure.

Composite Codes Suitable for Iterative Decoding

A first class of code structures suitable for iterative decoding comprises composite codes in which at least two constituent codes are combined, at least one of which is an injection code. Broadly speaking, an embodiment of the invention encompasses any composite code having an injection code as a constituent code. Source data elements are encoded as a composite code consisting of two or more constituent codes, with one or more of these constituent codes being injection codes. Each of the primary coded data elements of the injection code constituent code is also a coded data element of at least one other constituent code. Many different composite codes may be implemented.

Figure 4:
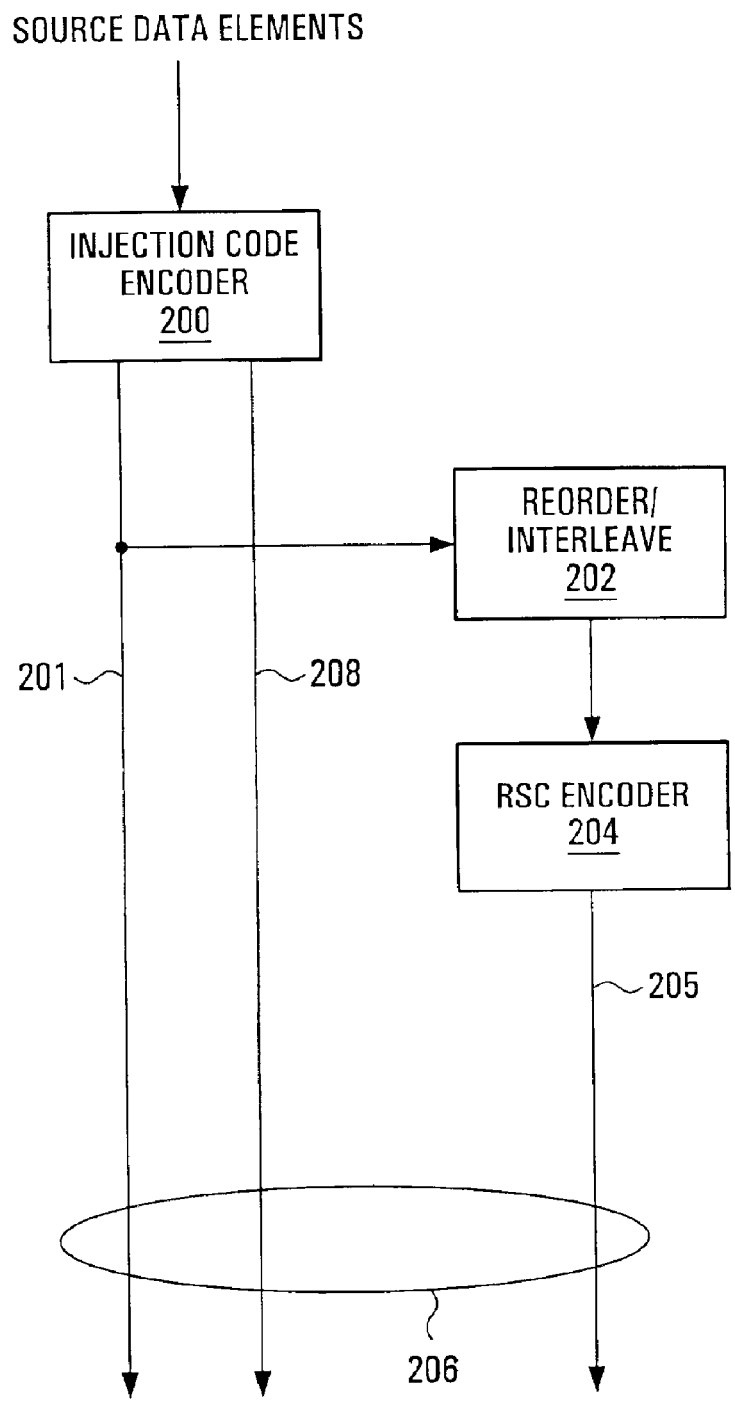
FIG. 4 is a block diagram of an encoder for a composite code featuring an injection code and an RSC code.

For example, a composite code might be provided featuring a single injection code, and a single RSC (recursive systematic convolutional) code, with the primary coded data elements of the injection code being the systematic data elements of the RSC code (but in a different order). Referring to FIG. 4, source data elements are first encoded using an injection code encoder 200. The primary coded data elements 201 of the injection code are then provided as input (after re-ordering 202) to a recursive systematic convolutional (RSC) encoder 204. That is, the primary coded data elements 201 produced as output by the injection code encoder 200 are interleaved and then provided as input to an RSC encoder. The primary coded data elements of the injection code, the auxiliary coded data elements of the injection code (if applicable), and the extra (i.e., parity) data elements of the RSC code are provided as output 206 by the composite coding method.

Dual-injection Double-Interlock Codes

Figure 5:
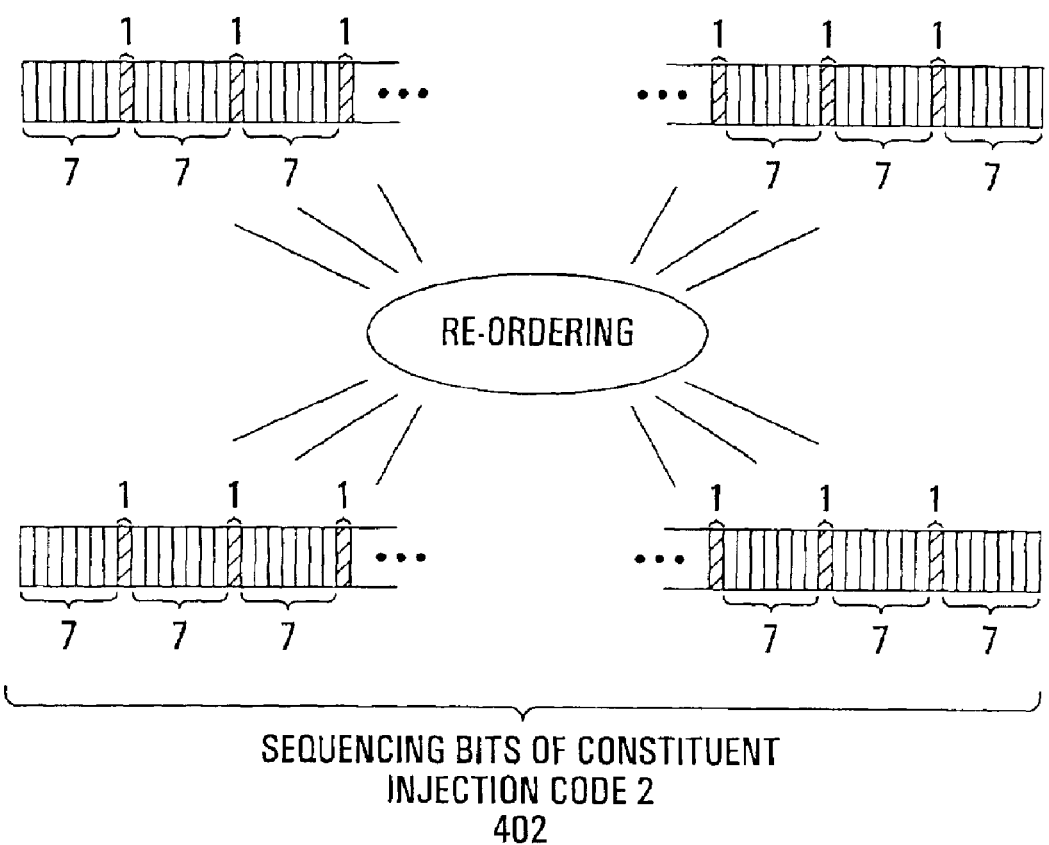
FIG. 5 is a diagrammatic illustration of a composite code featuring two injection codes whose primary coded data elements overlap completely.

Referring now to FIG. 5, an example of a composite code of this type is shown diagrammatically. For this example, a composite code having two constituent injection codes is provided in which all the primary coded data elements of one injection code overlap with those of the other injection code. This type of composite code is referred to herein as a DIDI (dual-injection double interlock) code since there are two constituent injection codes, and the primary coded data elements of each constituent injection code overlap completely with the primary coded data elements of the other constituent injection code. More specifically, shown is a first sequencing bit stream 400 produced by the first constituent injection code, this being the same as primary coded elements of first code, and a second sequencing bit stream 402 produced by the second constituent injection code, this being the same as primary coded elements of second code. The first sequencing bit stream 400 is "produced by" the first constituent injection code in the sense that the bit stream satisfies the constraints of the first injection code. The second sequencing bit stream 402 is identical to that of the first sequencing bit stream 400, but reordered. That is to say, the sequencing bit stream 400 satisfies a first set of constraints associated with a first injection code, and the same sequencing bit stream 400 reordered to form the second sequencing bit stream 402 satisfies a second set of constraints associated with a second injection code. In a preferred embodiment, both the first and second injection codes are identical.

For example, in one embodiment both the injection codes have a structure defined by the injection code encoder of FIG. 1 which inserts a state-derived bit in every eighth sequencing bit location. Thus, every eighth bit of the first sequencing bit stream 400 is an inserted bit of the first injection code. Similarly, in the re-ordered sequencing bit stream 402, every eighth bit is an inserted bit of the second injection code. This is shown FIG. 5 by shading every eight bit in both the first and second sequencing bit streams 400, 402.

The overall code rate of the composite code of FIG. 5 is r=¾ (ignoring a few extra bits required to ensure that each constituent injection code ends in the all-zeros state). This overall code rate follows directly from the fact that every eighth sequencing bit in each constituent injection code is an inserted bit for that constituent code. Thus, on average, every 8 sequencing bits will include one inserted bit for the first constituent injection code, and one inserted bit for the other constituent injection code. This leaves, on average, 6 information bits (source bits of the composite code) for every 8 coded bits, giving an overall code rate of ⅝, or ¾. If the block size of the composite code was "k" information bits, the number of bits overlapping between the two constituent injection codes would be (4/3)*k (1.333*k). That is, if the composite code had a block size of 900 information bits, the number of bits re-ordered (interleaved) between the two constituent injection codes would be 1200. It is important to recognize that the code rate of each of the two constituent injection codes, considered in isolation, is $r=7/8$, but the overall code rate of the composite code structure, taking both constituent injection codes into consideration, is $r=3/4$.

Each primary coded data element of either injection code appears exactly twice in the larger code: once in one injection constituent code, and again in the other injection constituent code. This example composite code thus does indeed possess the characteristic noted earlier: there are at least two instances of each injection code primary coded data element in the overall code.

Let us assume that we want to design such a composite code in which both constituent codes satisfy individually the constraints associated with the encoder of FIG. 1. This amounts to being able to determine if a given sequence is a valid codeword of the code.

To begin, it is to be understood that ultimately any linear encoder can be represented in the form of matrix multiplication as follows:

$$v=Gu$$

where u is a vector of information bits, G is a generator matrix for the (linear) code being considered, and v is the resulting codeword. This is standard "linear block code" theory notation.

Another matrix which is associated with linear block codes is the parity-check matrix H (not necessarily unique). An ordered set of data elements v is a codeword of a code if and only if:

$$Hv=0$$

i.e., the parity-check matrix represents all of the constraints on the relationships between data elements imposed by the code. Basically, the parity check matrix H allows a determination of whether a given sequence is a codeword or not.

A parity check matrix can be built for the encoder of FIG. 1, and also for the DIDI composite code being described with reference to FIG. 5 as well be detailed below. Once the constraints of a code or constituent code are known, it is a well understood process of calculating parity-check matrices and generator matrices, see for example Lin & Costello, Error Control Coding: Fundamentals and Applications, Prentice-Hall, 1983.

For the sake of completeness, an example method of determining a parity check matrix H for a DIDI code (FIG. 5) based on the encoder of FIG. 1 will be described. The discussion of H matrix generation given below does not quite correspond exactly in a minor detail to what is shown FIG. 5. In FIG. 5, the sequencing bit stream of each constituent injection code is shown to end with 7 source bits of the constituent code, whereas in the discussion presented below, source bits following the last inserted bit position in each constituent injection code are not considered so as to make the matrices a more manageable size. This minor detail does not change the essence of the discussion, but is simply noted for completeness.

The parity check matrix H can then be used to determine the generator matrix G and thus determine a possible encoder structure. The determination of G from H is a routine computation.

Given a sequence of bits, say 48 bits, it can be determined if this is a "valid" sequence (of sequencing bits) for FIG. 1. One can determine if the sequence is a "valid" sequence for FIG. 1 by processing the first 7 bits of the sequence being tested (according to FIG. 1). Next, the next bit that would be inserted is determined (assuming the rest of the sequence of bits does not exist) and this bit is compared to the value of the corresponding bit in the sequence. If there is a match then the process continues. If there is not a match, then the sequence is "invalid". This is repeated until the end of the sequence (assuming the bit values at all inserted bit positions match—if there ever is a mismatch, the comparison can be aborted). Now, considering FIG. 5, re-order the bits according to the interleaver pattern, and ask again, is the (re-ordered) bit sequence "valid" with respect to FIG. 1? If the answer is "yes" in both cases, then the sequence is indeed a codeword of the overall composite code depicted in FIG. 5. If the answer is "no" in either or both cases, then the sequence is not a codeword of the overall code (depicted in FIG. 5). This provides a way of determining if a sequence of bits is a valid codeword of the overall code. This then, in a sense, amounts to a "parity-check" matrix H discussed above, because one can say a particular sequence "is a codeword" or "isn't a codeword", and that is precisely what a parity-check matrix is about.

For the example DIDI code of FIG. 5, a set of constraints come from the first constituent injection code, and another set of constraints come from the second constituent injection code.

To identify the parity check matrix for a single injection code requires examining the constraints associated with a single injection code. It can be seen in FIG. 1 that the only "constrained" data elements are those at the inserted bit positions (recall that at this point in the discussion FIG. 1 is being considered in isolation). Thus, there is a parity constraint associated with each inserted bit position. FIG. 1 shows that certain bit positions are "constrained", and others are not. This indicates that when creating an H matrix for a code having the code structure produced by the encoder of FIG. 1, a constraint can be associate with each and every inserted bit position. Then it is simply a matter of determining the parity constraint for each such bit position.

To determine the parity constraint associated with each inserted bit position a determination is made of which source bit positions affect the inserted bit position being considered. If a source bit position does not have any effect on an inserted bit position, then that source bit position is not part of the parity constraint for the inserted bit position being considered; conversely, if a source bit position does affect the inserted bit position being considered, then that source bit position is part of the parity constraint for the inserted bit position being considered.

It is possible to determine which source bit positions affect which inserted bit positions by functionality equivalent to that of running FIG. 1 for each possible source bit position; i.e., set one and only one source bit to 1 (and all other source bits to 0), and "run" FIG. 1 to see which inserted bit positions have value 1. These are the inserted bit positions affected by the source bit position being considered.

Figure 6:
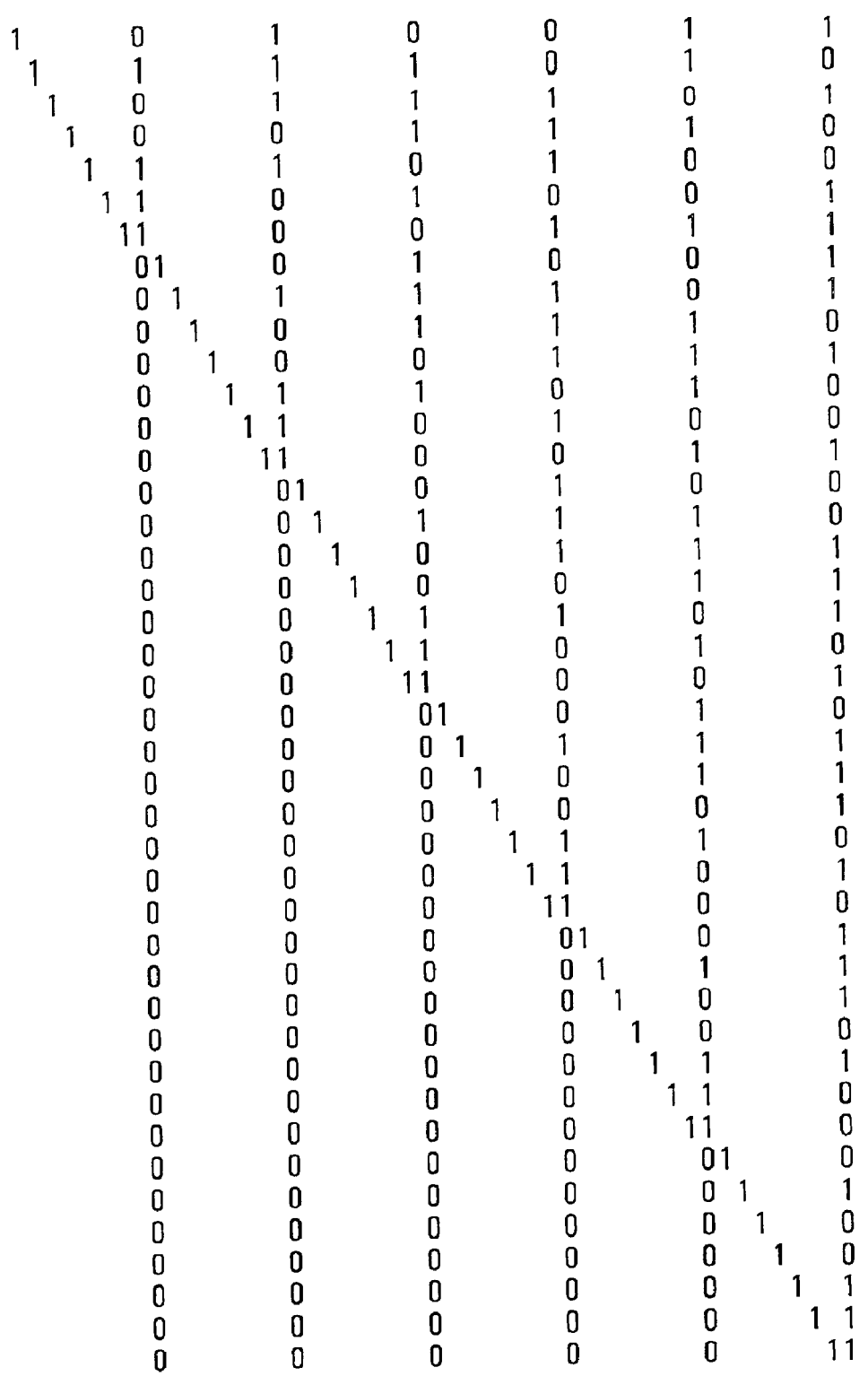

For example, assuming that the number of sequencing bits=48, then there would be 42 source bits and 6 inserted bits (FIG. 1 is being considered here in isolation). FIG. 1 can be run for each source bit position (all 42) and the effect upon the six inserted bits can be determined. For example, FIG. 6 illustrates the results of each source bit position on the six inserted bit positions. FIG. 6 is a 42 row×48 column matrix where only the contents of the columns associated with inserted bits are shown together with the source bits that are set, all remaining positions being zero. This matrix can be used to generate the parity check matrix. For the sake of simplicity assume that the parity check matrix applies to 48 bit sequence re-ordered to consist of 42 consecutive source bit positions followed by the 6 inserted bit positions. Referring to FIG. 6, it can be seen that set source bits in the second, fifth, sixth and seventh source bit positions will set the first inserted bit location. Thus a first row of a parity check matrix which applies only to the first inserted bit position can be determined to be [010011100000000000-00000000000000000000000100000] where there is a "1" in the second, fifth, sixth and seventh columns, and a "1" in the $43^{rd}$ position since that position corresponds to the first inserted bit location. This can be repeated for each inserted bit position to get the parity check matrix shown in FIG. 7. This represents completely the constraints imposed by the encoder of FIG. 1 for the case where there are 48 sequencing bits, and the eighth sequencing bit is the first inserted bit. Hv=0 means a sequence v is a codeword of the encoder of FIG. 1 thus configured.

In a dual-injection double-interlock (DIDI) code (as in FIG. 5), the constraints introduced by the first encoder will still need to be satisfied, as summarized by Hv=0. Furthermore, the constraints introduced by the second code need also to be satisfied. Since in this example codewords of the second code are just reordered codewords of the first code, any codeword of the second code can be expressed as v2=Rv, where R is a re-ordering matrix. Since the second encoder is the same as the first (in this example), it has the same parity check matrix meaning that v2 is a codeword only if Hv2=0=HRv. This summarizes the constraints introduced by the second encoder. The parity check matrix for the overall composite code can be expressed as $$H_c = \begin{bmatrix} H \\ HR \end{bmatrix}$$

HR is simply H with the columns permuted according to the re-ordering matrix R. Thus, for a sequence v to be a codeword of a DIDI code based upon the injection encoder of FIG. 1 and having re-ordering matrix R between the two sequences, $H_cV=0$ must be satisfied. This can be used to determine a generator matrix G for the composite code of FIG. 5. Typically, an implementation of the code will be achieved with a generator matrix G. It is worth noting, however, that optimizations are often possible that can allow significant reductions in the size of the matrix required for encoding.

In summary, for an injection code, the constrained bit positions are the inserted bit positions. The parity-check for each inserted bit position determines an H matrix, the parity check for an inserted bit position being simply those source bit positions that set this inserted bit position (and the inserted bit position itself). Each inserted bit position is a parity-check on a specific set of source bit positions.

This has been an example of how to build an encoder having the constraints of a DIDI code. Preferably, the code is adapted so that both constituent injection codes start and end in the zero state. The manner of handling the starting and ending states is not shown in the figure.

An extension of the above embodiment is a composite code featuring any number of constituent codes, each of which is an injection code. The overlap between constituent codes is such that each primary coded data element of any given constituent injection code is also a primary coded data element of at least one other constituent code.

The encoding of a constituent code used in a composite code may have to take into account some or all of the other constituent codes making up the composite code. Since the constituent codes overlap, the constraints of the various codes have to be satisfied simultaneously.

Interleaver

An appropriate descriptor for the class of codes of which FIG. 5 is an example is "dual-injection double-interlock" (DIDI). The composite code consists of two injection codes (hence, "dual-injection"), and the inserted bits of each constituent injection code are source bits of the other constituent injection code (hence, "double-interlock"). To elaborate, the inserted bits of one constituent code, which in a sense are "output" bits of that code, serve as "input" bits for the other constituent code, and vice versa, and the two directions of this passing of "output-to-input" must be satisfied simultaneously. The term "double-interlock" helps convey this simultaneous two-way interconnection between the two constituent injection codes.

The bit re-ordering that links the two constituent injection codes is a key part of the composite code design for a "dual-injection double-interlock" composite code. The general structure provides the potential for powerful error-correcting performance, but effective bit re-ordering between the two constituent codes is required to exploit this potential. Typically, a re-ordering pattern is generated using a "random-with-constraints" approach. Re-ordering indices are generated using pseudo-random-number techniques, and each new "index-to-index" mapping so generated is tested against various constraints before being included in a re-ordering pattern being incrementally assembled.

It is important to recognize that the error-correcting performance achieved by an iteratively-decoded error-correction scheme depends not only on the inherent error-correcting capability of the composite code itself, but also on how effective iterative decoding is at approaching this capability. The tests associated with re-order pattern generation take both factors into account. The performance tests take into account that some linear state sequencer state transitions are not possible for state transition intervals involving inserted data elements.

Typically, a variety of tests are used. These tests can include, but by no means are limited to, the following types of tests:

1) $d_{min}$ Testing

The purpose of this testing is to ensure that the minimum distance ($d_{min}$) of the composite code is no less than some prescribed value. This testing is especially important for error-correction performance at very low error rates. For higher values of $d_{min}$, this testing can become very computationally intensive.

2) Sequencing-Weight-2 Path Control

This type of testing relates to achieving good "distance spectrum" properties for the composite code. The distance spectrum of a linear error-correcting code is the distribution of error-pattern "distances" (i.e., the number of error patterns at each possible "distance"). The minimum distance, $d_{min}$, discussed in point 1, is where the distance spectrum of a code begins.

A detailed discussion of "sequencing-weight-2 path control" is beyond the scope of the current discussion. However, a short description will be presented here to provide some insight into the topic. With reference to FIG. 5, consider starting with any given sequencing bit in either of the two constituent injection codes. Now, suppose an event (for the present purposes, the term "event" can be taken to mean an error pattern of a constituent code) can be formed from this given bit by selecting one and only one other sequencing bit in the constituent code being considered. For this second bit, switch over to the other constituent code (according to the re-ordering pattern being used). Now, suppose that a second event can be formed (in the second constituent code) from this second bit by selecting one and only one other sequencing bit (in the second constituent code). By continuing this process of selecting one and only one other bit to form an event, switching over to the other constituent code, selecting another bit, and so on, a "sequencing-weight-2" path (i.e., a path made up of segments that are "sequencing-weight-2" events of the constituent codes) is built.

Sequencing-weight-2 path control involves limiting how long such paths can be. If, at some point, a sequencing bit is selected that cannot be formed into an event by selecting only one other sequencing bit (i.e., at least two other sequencing bits have to be selected to form an event), the "sequencing-weight-2 path" ends. With the composite code of FIG. 5, through careful design of the re-ordering pattern (interleaver) that connects the two constituent injection codes, it is possible to cap the maximum "sequencing-weight-2" path length at 2, even though there is but one inserted bit for every eight sequencing bits in each constituent injection code.

Controlling the maximum "sequencing-weight-2" path length has a very positive impact on the general distance spectrum properties of the composite code (which in turn contributes to improved error-correction performance). In addition, such path length control can allow a higher $d_{min}$ to be achieved, which is particularly significant for applications requiring very low error rates. Finally, DIDI composite codes are suited for iterative decoding, and path length control can enhance the rate of iterative decoding convergence, an important practical concern.

3) Independence Testing

This testing attempts to maximize the independence (minimize the correlation) of bit value estimates in iterative decoding. In iterative decoding, "improved" bit value estimates are generated for each sequencing bit for each of the two constituent injection codes. The objective of independence testing is to ensure a reasonable level of independence between the two estimates calculated for each sequencing bit.

The primary focus in the design of independence tests is to improve the effectiveness of iterative decoding in approaching the error-correction potential of a composite code. With an iteratively decoded error-correction scheme, however, many factors are inter-related, and though the design objective of independence testing is to improve decoder effectiveness at approaching code potential, the testing in fact also helps to enhance the code potential itself.

4) Encoder Concerns

By imposing certain constraints on the re-ordering pattern (i.e., interleaver), the process of encoding the composite code, which involves matrix multiplication, can be significantly simplified. As mentioned earlier, the encoding operation for a "dual-injection double-interlock" composite code must ensure that the constraints imposed by both constituent injection codes are satisfied simultaneously. To achieve this requires computing a matrix-times-vector multiplication (using modulo-2 arithmetic). Approaching this in a "straight-forward" manner, the encoding matrix for the code of FIG. 5 would have k/3 rows and k columns. There are "k" information bits, and on average, for each 6 information bits, there are 2 inserted bits (one associated with each of the two constituent codes), and so the matrix would have k columns and 2*k/6 (i.e., k/3) rows. However, by recognizing that the effect of the information bits on the inserted bits can be computed by simply running the information bits through the state sequencers, and that this leaves only the effect of one constituent code's inserted bits on the other constituent code's inserted bits (and vice versa), the size of the matrix required for encoding can be reduced to (k/6)*(k/6), or a reduction in size by a factor of 12. Using this approach, both the memory requirements and the processing requirements associated with encoding are dramatically reduced. For a code with a block size of k=1504 bits (an MPEG transport packet), the encoding matrix would require only 8 kB (kilobytes) of storage, or only 2 kilowords on a 32-bit processor. To ensure that this efficient approach can be used in encoding, all that is required is the addition of a simple matrix-rank test to the re-order pattern generation process.

Figure 9:
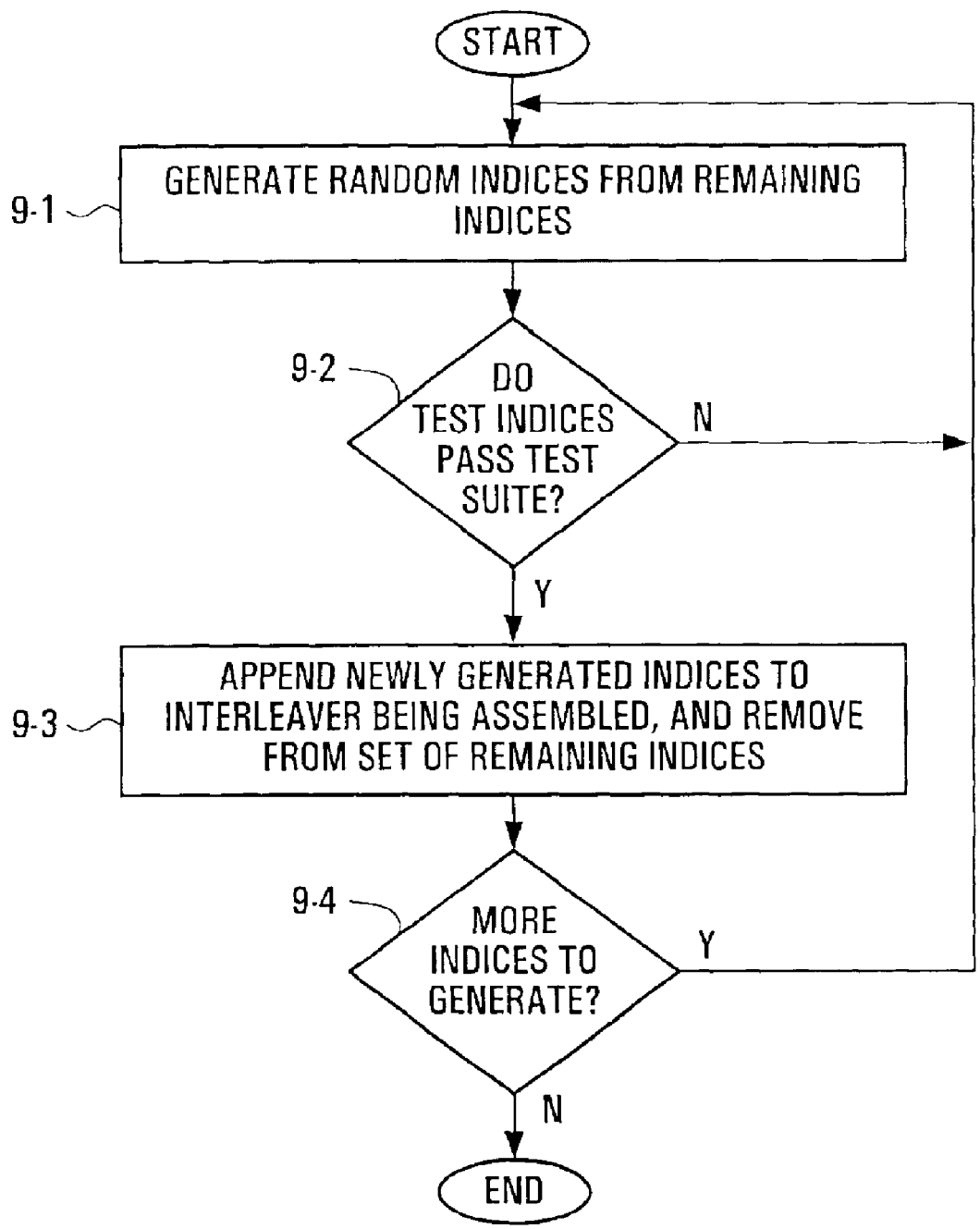

FIG. 9 is a flowchart which summarizes the development of the re-ordering matrix (i.e., interleaver). The method begins with the random selection in step 9-1 of a pair of indices which will indicate where a random element of the first code will end up in the second code. Then, one or more of the above discussed tests, or some other suitable tests, are applied in step 9-2, and if the tests pass (yes path, step 9-2), then the indices are accepted and appended to the interleaver being assembled (step 9-3), and those indices are removed from further consideration. Then the process continues with the random selection of two more indices and so on until the entire matrix is complete assuming there are more indices to generate (yes path step 9-4, or the failure of the previous indices, no path step 9-2). Not shown in the flowchart is possible "back-tracking" of the incremental interleaver generation process which is used if the process becomes "stuck" at some point (i.e., no possible index-pair from the remaining indices passes the tests, and so some previously-established mappings must be "un-done" so that the process can continue).

Code Structures Suitable for Iterative Decoding Based on a Single Injection Code The above description has focused on code structures suitable for iterative decoding which are based on combining two or more constituent codes. Recall that more generally, a fundamental attribute associated with the use of injection codes in code structures intended for iterative decoding that is common across all such code structures is that there are at least two instances of each primary injection code data element. That is, whenever an injection code is used in forming a code structure suitable for iterative decoding, each primary coded data element will appear at least twice in the overall code structure. Examples have been presented featuring two constituent injection codes in forming a composite code, or one injection code and one RSC code as constituent codes.

A more subtle situation occurs when a code suitable for iterative decoding is formed out of a single injection code (and no other code). That is, a code suitable for iterative decoding can be formed where a single injection code is in fact the entire code. For such a code structure to be suitable for iterative decoding, however, each primary coded data element must be replicated two or more times in the single injection code. It is especially important here to fully understand the notion of an "instance" of a data element. As an illustration, the 500th and 900th primary coded data elements of an injection code may in fact be the exact same data element (i.e., the values of the two elements are always equal) but the two positions are two distinct instances of the single data element. Using only a single injection code but replicating each primary coded data element two or more times is in fact not that big a step from the "dual-injection" construction examined previously. Consider starting with a dual-injection structure, and then connecting the two separate injection codes to form a single, continuous injection code having twice the length of the original codes. Each primary coded data element of this longer injection code is replicated exactly twice. This "joined" dual-injection construction is a simple example of the general single-injection code structure being considered here. More elaborate single-injection constructions can be created by incorporating additional replications of primary coded data elements, and applying further re-ordering to the instances of the primary coded data elements. An appropriate term for this type of iteratively-decodable code construction is solo-injection self-interlock (SISI): there is only one injection code (solo-injection), and the primary coded data elements are interlocked within the single code (self-interlock).

Recap on Use of Injection Codes in Code Structures Suitable for Iterative Decoding A wide variety of codes suitable for iterative decoding can be envisioned that make use of injection codes. Three types have been discussed here: injection-RSC, dual-injection double-interlock (DIDI), and solo-injection self-interlock (SISI). These highlighted code types, however, represent merely a sampling of the myriad of possible constructions. What manner of code structure is most appropriate for an application depends on the specifics of the application.

It is the replication of the primary coded data elements of an injection code that is of concern in the design of a code structure suitable for iterative decoding. This is the reason behind the labeling of the sequencing data elements of an injection code as "primary" coded data elements: these are the coded data elements that must interlock when an injection code is used in a code structure being designed for iterative decoding. This explains the distinction between primary coded data elements and the auxiliary coded data elements.

Iterative Decoding of Codes Involving Injection Codes, Including SISO Decoding of Injection Codes Iterative decoding of codes involving injection codes is based on injection code structure. That is, in the design of an iterative decoder for a code that incorporates one or more injection codes, the design elements that pertain to a particular injection code are based on the structure of that injection code.

The general concepts of iterative decoding are not tied to any particular code type, and can be applied to many different types of codes. Thus, for a code incorporating one or more injection codes, one begins with the structural characteristics of the injection code(s) being used (as well as the characteristics of any other codes being used), and through application of iterative decoding concepts, an appropriate iterative decoding method can be created. The design of an iterative decoder for an iteratively-decodable code having one or more injection codes as part of its structure is thus a matter of studying iterative decoding literature, and then marrying these notions with the structure of the iteratively-decodable code being considered. Two useful references on the topic are: J. Hagenauer, E. Offer, and L. Papke, "Iterative decoding of binary block and convolutional codes", in IEEE *Transactions on Information Theory*, Vol. 42, No. 2, March 1996, pp. 429–445, and P. Robertson, P. Hoeher, and E. Villebrun, "Optimal and suboptimal maximum a posteriori algorithms suitable for Turbo decoding", in *European Transactions on Telecommunications*, Vol. 8, No. 2, March–April 1997, pp. 119–125, both hereby incorporated by reference.

Figure 10:
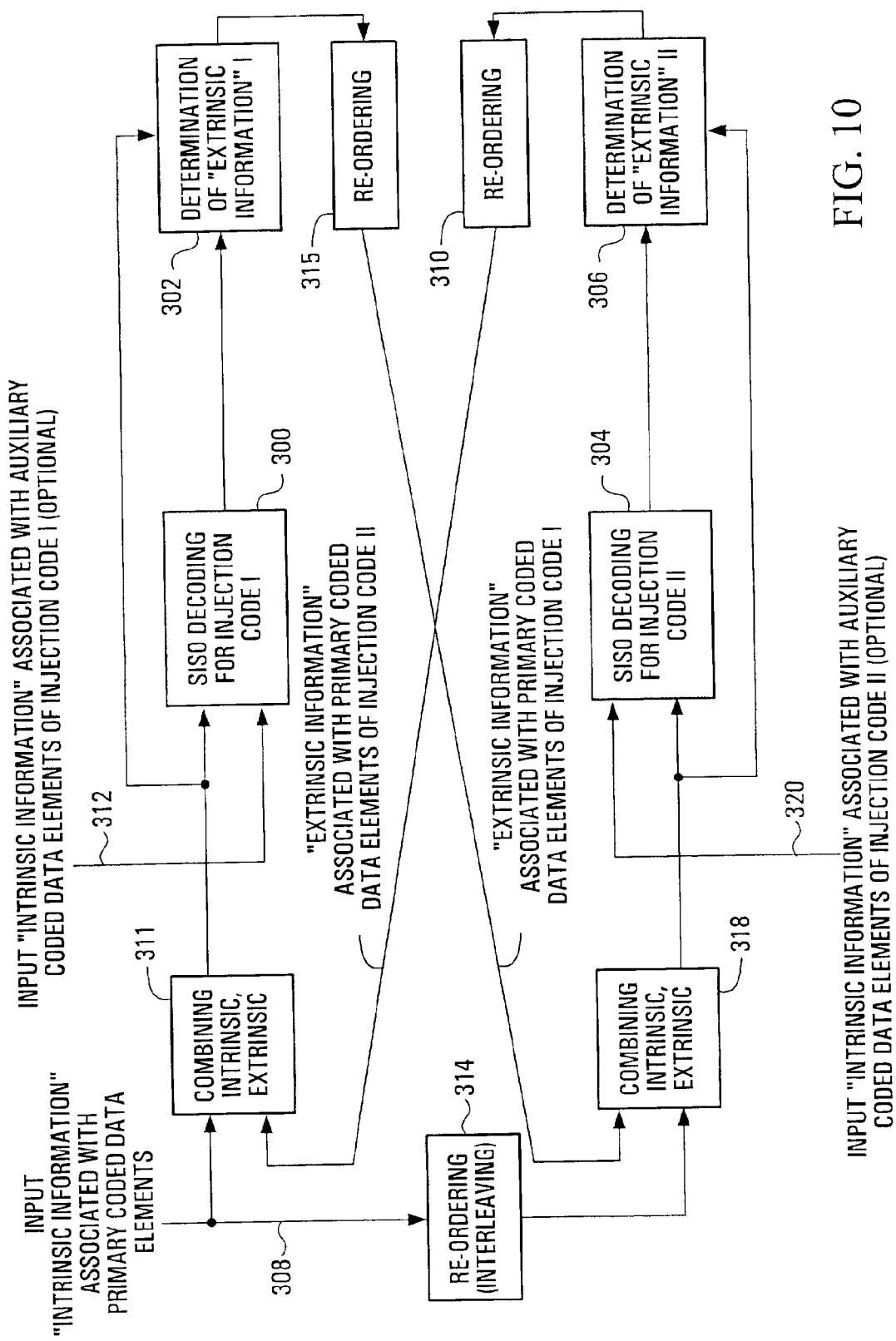

Some concepts related to iterative decoding will now be introduced, with reference to the example (DIDI) composite code of FIG. 5 and with reference to a schematic diagram of a decoder in FIG. 10. These concepts are easily adapted to a more generalized composite code. Iterative decoding of a DIDI code involves soft-in soft-out (SISO) processing that alternates between the two constituent injection codes. SISO processing for an injection code involves generation of new confidence estimates for the values of the primary coded data elements based on input confidence estimates for the primary coded data elements, and if applicable, the auxiliary coded data elements. FIG. 10 will be described starting with the SISO processing of the first constituent injection code indicated generally by 300. After SISO processing of the first constituent injection code, extrinsic information is determined at 302 that provides additional input information that is used in the SISO processing of the second constituent injection code. Likewise, SISO processing of the second constituent injection code 304 produces extrinsic values at 306 that provide additional input information used in the SISO processing of the first constituent code. The extrinsic values produced by soft-in soft-out processing 300,304 amount to differences between "soft" output values and corresponding "soft" input values. These differences are essentially the "improvements" in data value estimates resulting from soft-in soft-out processing. SISO processing 300,304 is aware of the relationships that must exist between data elements (i.e., the code structure), and it is this knowledge that is the basis for the determination of new data value estimates from input data value estimates.

At the input to the SISO processing 300 of the first injection code, intrinsic information 308 associated with primary coded data elements is combined at 311 with the extrinsic information from the other constituent code determined in 306 after reordering 310. There may also be other intrinsic information 312 input to the SISO processing 300 of the first injection code in the event there were auxiliary coded data elements in the first injection code. Similarly, the intrinsic information 308 is reordered 314 and combined at 318 with the extrinsic information associated with the first injection code reordered at 315 and input to the SISO processing for the second injection code 304. There may also be other intrinsic information 320 input to the SISO processing 304 of the second injection code in the event there were auxiliary coded data elements in the second injection code. At the outset of iterative decoding, there is no extrinsic information yet, and so the "combining intrinsic, extrinsic" component simply passes intrinsic information directly to the SISO decoding component.

In addition to extrinsic quantities, there are also "decisions" associated with each SISO processing pass. These "decisions" are what the iterative decoder would produce as output if the iterative decoding were to stop at that point. For example, with the DIDI composite code of FIG. 5, the decisions would be bits (i.e., 0 or 1), since the code is binary.

The "soft" quantities that are worked with during the iterative decoding of a code are multi-valued quantities that represent confidence estimates in data element values. For example, with a binary code, a possible range of "soft" values could be as follows: the numbers {0.1 0.2 0.3 0.4 0.5 0.6 0.7} could represent increasing confidence estimates in a bit being a '0' bit, the numbers {−0.1 −0.2 −0.3 −0.4 −0.5 −0.6 −0.7} could represent increasing confidence estimates in a bit being a '1' bit, and 0.0 could represent that '0' and '1' are both equally likely.

The description of iterative decoding provided above is intended only as a very basic introduction to the topic. For more information, the interested reader is referred to other sources. There are a large number of references on the topic of iterative decoding; a small sampling of the material that is available is included at the end of this description.

SISO processing is well known in the art, but some modifications need to be made to allow the SISO processing of injection codes. For decoder state transition intervals relating to positions in the received data stream which do not correspond to inserted bit/element positions, completely standard SISO processing is appropriate. However, for decoder state transition intervals relating to positions in the received stream which do correspond to inserted bit/element positions, certain state transitions are no longer possible, and as such a slightly different set of state transitions need to be considered for the state transition interval. The impossible state transitions are removed, and the remainder of the state transition possibilities are processed in accordance with normal SISO processing. Because all states are still reachable even after the impossible state transitions have been removed (as guaranteed by Injection Code Specification Five), there is no problem of having to deal with "impossible states", which would significantly complicate matters.

Figure 8A:
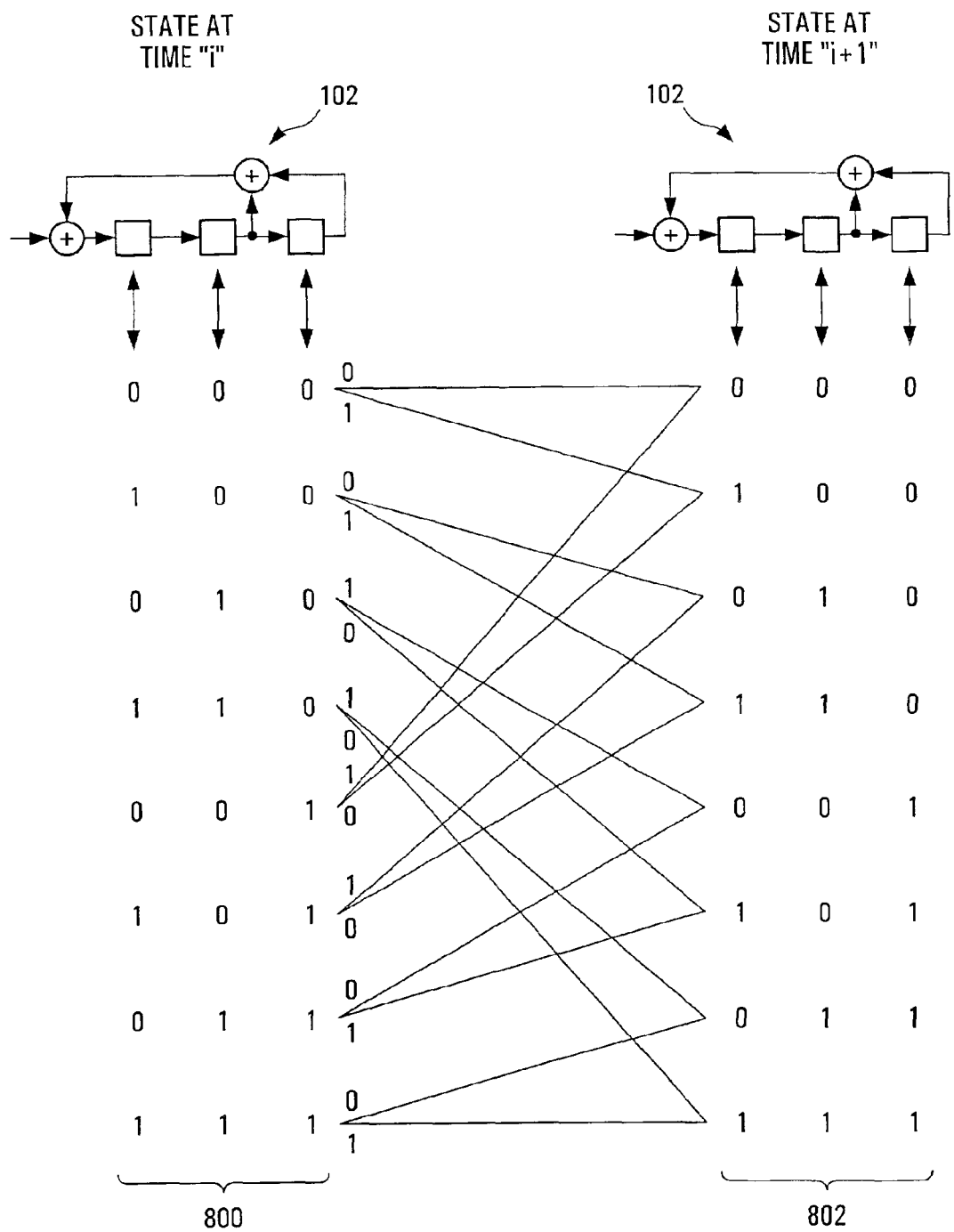
FIGS. 8A and 8B are examples of state transition intervals for the encoder of FIG. 1 for a non-inserted bit position and an inserted bit position respectively.
Figure 8B:
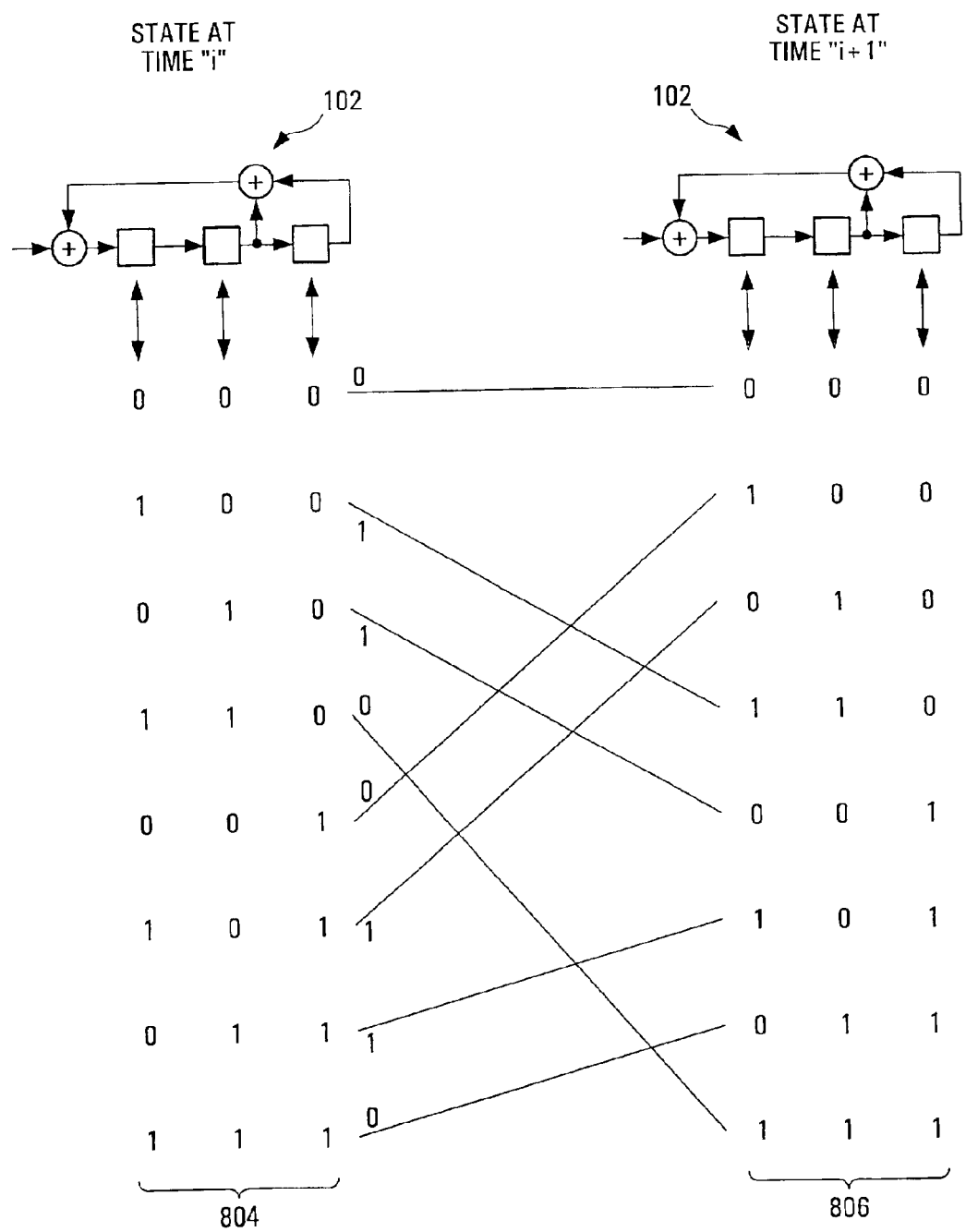

For example, referring to FIG. 8A, shown is a state transition interval for the injection code of FIG. 1 for a position which does not have an inserted data element. On the left of the Figure shows the state at time "i" 800 and on the right of the Figure shows the state at time "i+1" 802, with in both cases the state being mapped to the contents of the linear state sequencer 102 of FIG. 1. The state transitions occur according to the next bit at the input to the linear state sequencer. FIG. 8A is a conventional state transition interval. Referring now to FIG. 8B, shown is a state transition interval for the injection code of FIG. 1 for a position which does have an inserted data element. On the left of the Figure shows the state at time "i" 804 and on the right of the Figure shows the state at time "i+1" 806, with in both cases the state being mapped to the contents of the linear state sequencer 102 of FIG. 1. The state transitions occur according to the next bit at the input to the linear state sequencer, but since this next bit is an inserted bit, it can only be one possibility, as determined by the previous state, and as such, there is only one possible state transition out of each state 804 to each state 806. It is worth noting that all states at time "i+1" are still reachable (see Injection Code Specification Five).

Once the structure of the state transition intervals is understood in this manner, SISO processing according to otherwise conventional means is possible. Preferably, the SISO decoding is a log-MAP approach or derivative thereof.

It is noted that iterative decoding as described above can be performed on any quantities representative of a sequence of primary coded elements of a code suitable for iterative decoding as described above (i.e. a code having at least one injection code, and in which every primary coded data element appears at least twice.) For example, the decoding can be performed on a signal embodied on a transmission medium, or on data read from a storage medium.

Iterative Decoding with Early Stopping

Another embodiment of the invention provides a novel method of iterative decoding with early-stopping. The method can dramatically reduce the average processing requirements associated with iterative decoding. The method that has been developed involves checking a set of conditions on an on-going basis during the course of iterative decoding. If all of the conditions become satisfied, iterative decoding is halted (i.e., no further SISO processing is performed). The conditions apply to each multiple-instance data element. That is, the conditions apply to all data elements with two or more instances.

Preferably, the method involves checking three conditions. First, the change in the extrinsic associated with each instance of a data element, not including the next instance to undergo SISO processing, must not disagree with the decision associated with this same instance. If there is no change in the extrinsic, there is considered to be agreement with any possible decision—this is the reason for the double-negative wording "must not disagree". Note that this condition is not saying that the extrinsic itself must agree with the decision, only that the "movement" of the extrinsic must support the decision. The extrinsic may in fact disagree with the decision, and this is acceptable—all that is required is that the change in the extrinsic concurs with the decision. It is important to note that the change in extrinsic being considered here is for a given instance of a data element, and not between instances of a data element. The change being considered is the change between the new extrinsic calculated "this time" and the old extrinsic calculated "last time". As an illustration, consider the example DIDI code of FIG. 5. For each data element, there is an extrinsic value associated with the first constituent injection code, and there is also an extrinsic value associated with the second constituent injection code. There will thus also be two "change in extrinsic" values for each data element: one change-in-extrinsic associated with the first constituent code, and another change-in-extrinsic associated with the second constituent code.

Second, decisions must agree between all instances of a data element. For example, with the DIDI code of FIG. 5, the decisions associated with the SISO processing of the first constituent injection code must agree with the decisions associated with the SISO processing of the second constituent injection code. Of course, during iterative decoding, new decisions are constantly being made. It is the most recent decision associated with a data element instance that is of relevance when comparing.

Third, the decisions must be unambiguous. In SISO processing, it is possible for there to be no clear winner for the decision associated with a certain data element instance. For example, for a certain data bit instance, both 0 and 1 may be equally good choices (basically, the decision is a coin-toss). There must be only one best-choice decision for each data element instance. As with the previous condition, it is the most recent decisions that are of relevance here.

When those three conditions are satisfied, the iterative decoding process is halted. Otherwise, iterative decoding continues (unless the maximum number of iterations has been reached).

Consider the use of this method with the example DIDI code of FIG. 5. If, after SISO processing of either constituent code, the following conditions are met:

a) The changes in extrinsics for the constituent code just processed do not disagree with the new decisions made for this constituent code;

b) the new decisions just made agree with the decisions made in the latest SISO processing of the other constituent code; and c) there was no ambiguity in the making of decisions for either of the two constituent codes, then iterative decoding is halted, and any further processing that would have otherwise been performed is saved.

Figure 11:
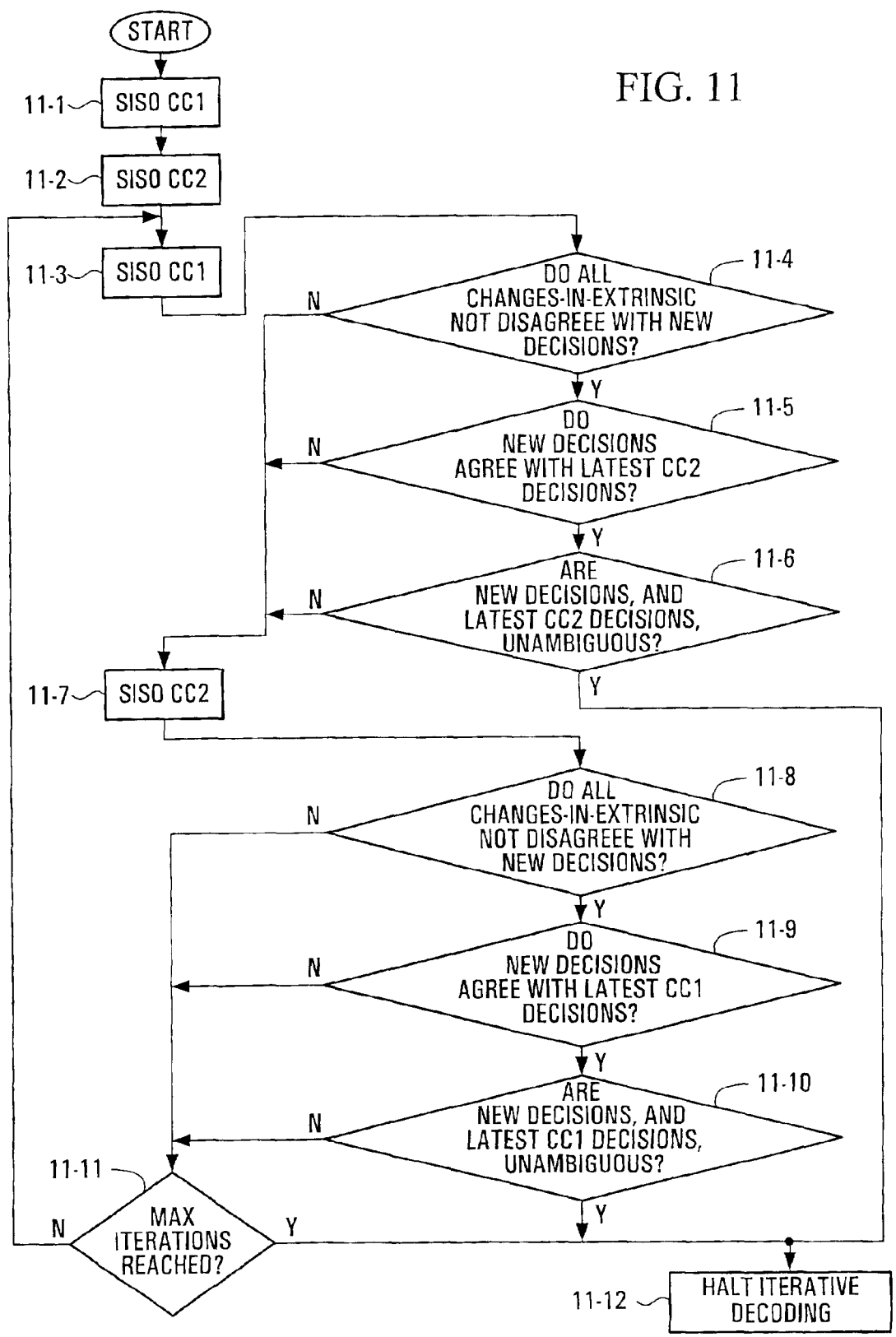
FIG. 11 is a flowchart of a method of stopping an iterative decoder earlier than would normally occur.

FIG. 11 shows a flow-chart for this method of iterative decoding with early stopping, for a composite code consisting of two constituent codes. Each constituent code may be an injection code, but is not necessarily so. For example, this method could be applied to decode the code of FIG. 5 which depicts a composite code consisting of two injection codes, but the method is equally applicable if one or more constituent codes are convolutional codes, such as in FIG. 4. Preferably, the SISO decodings of the constituent codes are log-MAP approaches or derivatives thereof.

The method starts with SISO decoding of the first constituent code (SISO CC1 step 11-1), followed by SISO decoding of the second constituent code (SISO CC2 step 11-2). Next, the first constituent code is SISO decoded once again in step 11-3. The changes in the extrinsic information between the SISO decoding just completed and the previous SISO decoding for the same constituent code are compared, in step 11-4, with the decisions just made as part of SISO CC1 step 11-3. If the changes in the extrinsic information support (i.e., do not disagree) with the decisions just made (yes path step 11-4), then the tests continue; otherwise (no path step 11-4), iterative decoding continues with SISO processing of the second constituent code (SISO CC2 step 11-7).

In the next test (step 11-5), the decisions associated with the SISO decoding just completed (i.e., decisions of step 11-3) are compared with the decisions of the most recent SISO decoding of the other constituent code: if there is any disagreement in the decisions (no path step 11-5), iterative decoding continues with SISO decoding of the second constituent code at step 11-7. If there is full agreement in the decisions (yes path), a subsequent test is performed at step 11-6.

The next test checks whether there was any ambiguity in the decisions just made, or in the making of the decisions in the latest SISO processing of the other constituent code. If the decision making was not unambiguous (no path step 11-6), iterative decoding continues with SISO decoding of the second constituent code at step 11-7. Otherwise (yes path step 11-6), iterative decoding is halted at step 11-12.

After SISO processing of the second constituent code at step 11-7, the same set of three tests as described above are performed, but with the roles of the two constituent codes reversed. These tests are indicated as steps 11-8, 11-9 and 11-10. If any of these three tests fail (no paths, step 11-8, 11-9, or 11-10), iterative decoding continues with SISO processing of the first constituent code back at step 11-3, unless the maximum number of iterations has been reached, (yes path, step 11—11), in which case iterative decoding is halted at step 11-12. If all three tests pass (yes paths, steps 11-8,11-9,11-10), then iterative decoding is halted at step 11-12.

More generally, the early stopping method may also be applied to composite codes consisting of two or more codes. The method stops an iterative decoder decoding a composite code having at least two constituent codes. A partial iteration of the iterative decoder involves performing SISO decoding of one of the constituent codes. The method involves checking three conditions as follows for each multiple instance data element:

a) after each partial iteration a change in an extrinsic associated with each instance of a data element, not including a next instance to undergo SISO processing, must not disagree with a decision associated with this same instance;

b) decisions must agree between all instances of a data element;

c) decisions must be unambiguous;

and when the three conditions are satisfied, stopping the iterative decoder from performing any further partial iterations.

It is to be clearly understood that FIG. 11 only shows an example of the early stopping of iterative decoding. This method is by no means limited to use with codes involving injection codes, and can be used equally well with many other types of codes, such as Turbo codes and SCCC codes.

This method of early stopping may be applied to existing iterative decoders or decoding methods, or alternatively, may be implemented within a completely new iterative decoder/decoding method.

Closing Comments

It is to be understood that there are a wide variety of error-correction coding techniques that can be used with error-correction coding schemes employing injection codes, but may or may not have been explicitly mentioned. Such techniques include, but by no means are limited to: puncturing, shortening, trellis termination, linear and non-linear data-scrambling.

Further, where specific examples of encoders or encoding methods, decoders or decoding methods, early stopping methods, interleaver generation methods have been provided, it is to be understood that equivalent functionality embodied as an apparatus which may be any suitable combination of hardware and/or software, method, processing platform readable medium, is to be considered within various embodiments of the invention.

Figure 12:
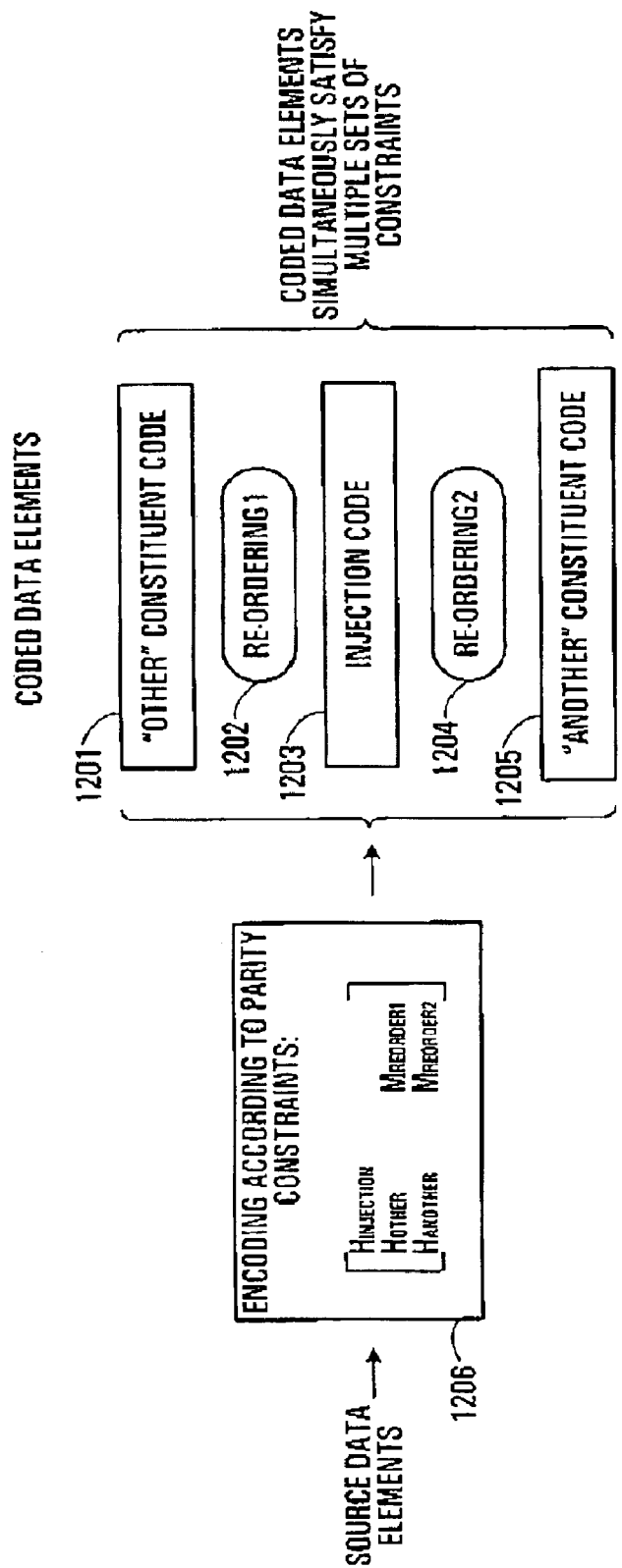
FIG. 12 is a diagrammatic illustration of a composite code in which a plurality of additional sets of constraints are applied.

Referring now to FIG. 12, shown is an example of a composite code encoder that applies a plurality of additional sets of constraints. The first set of constraints are illustrated generally by the "other" constituent code 1201. Two additional sets of constraints, represented by injection code 1203 and the "another" constituent code 1205 respectively are also shown. The constraints of these two other codes 1203, 1205 are applied to the primary coded data elements after respective re-orderings 1202 and 1204. While the example of FIG. 12 is particular to two additional sets of constraints, more generally any number of additional constraints can be applied. A matrix representation of the encoder is shown generally at 1206.

Numerous modifications and variations of the present invention are possible in light of the above teachings. It is therefore to be understood that within the scope of the appended claims, the invention may be practiced otherwise than as specifically described herein.

I claim:

1. An encoder adapted to encode a sequence of source data elements to produce a sequence of primary coded data elements satisfying a first set of constraints, the first set of constraints being equivalent to a set of constraints implemented by another encoder, the another encoder comprising a data organization component, a linear state sequencer and a state-to-data-elements converter, wherein:

the data organization component is adapted to receive the sequence of source data elements and to receive a sequence of state-derived data elements from the stat-to-data-elements converter and to output a data organization output sequence which includes every data element of the sequence of source data elements and which on an ongoing basis includes inserted data elements, each inserted data element comprising a state-derived data element output by the state-to-data elements converter;

the linear state sequencer being adapted to maintain a state consisting of state data elements and to perform linear state sequencing as a function of the data organization output sequence, which is provided as input to the linear state sequencer, and as a function of the state data elements;

the state-to-data-elements converter being adapted to produce said sequence of state-derived data elements, wherein each state-derived data element is a linear combination of the state data elements;

wherein the linear state sequencer is configured to satisfy the following specifications:

a) if the linear state sequencer state is zero at a time i, any on-zero data organization output sequence data element at time i will result in a non-zero state time i+1;

b) if the linear state sequencer state is zero at a time i, non-zero at time i+1, bat again zero at a later time k>i+1, then necessarily there must be a non-zero data organization output sequence data element at some time j, with i<j<k;

and wherein the data organization component and the state-to-data-elements converter are configured in relation to the linear state sequencer to satisfy the following specifications:

c) if the linear state sequencer state is non-zero at a time x, non-zero at a later time z>x, and non-zero for all times between x and z, the time z cannot be advanced indefinitely, in so doing increasing the duration of the time interval [x,z] during which the linear state sequencer state is always non-zero, without necessitating a non-zero data organization output sequence data element at some time y, with $x \leq y < z$;

d) data element insertion by the data organization component into the sequence of source data elements to produce the data organization output sequence does not render any linear state sequencer state unreachable;

the sequence of primary coded data elements being equal to the data organization output sequence.

2. An encoder according to claim 1 wherein the data organization component is adapted to insert inserted data elements on a periodic or pseudo-periodic basis.

3. A composite code encoder comprising:
an encoder according to claim 1;
a re-ordering function adapted to produce a re-ordered version of sequence of
a RSC (recursive systematic convolutional) encoder adapted to receive as input the re-ordered version of the sequence of primary coded data elements and to produce a sequence of coded data elements.

4. A composite code encoder comprising the encoder of claim 1; the composite code encoder being further adapted to apply a second set of constraints such that a re-ordered version of the sequence of primary coded data elements satisfies the second set of constraints simultaneous with the sequence of primary coded data elements satisfying the first set of constraints, wherein the second set of constraints is equivalent to an encoder having a structure of the another encoder of claim 1.

5. A composite code encoder comprising the encoder of claim 1, the composite code encoder being further adapted to simultaneously apply a plurality of additional sets of constraints to a plurality of other sequences of data elements, each of said additional sets of constraints being associated with a respective code and being applied to the respective other sequence of data elements, and each data element of the sequence of primary coded data elements occurring in at least one of the plurality of other sequences of data elements.

6. A self-interlock code encoder comprising an encoder according to claim 1, the self-interlock code encoder being further adapted to apply the first set of constraint to an augmented sequence of primary coded data elements in which each element of the sequence of primary coded data elements is repeated at least twice.

7. An encoder according to claim 1 wherein the state sequencer is an N state sequencer with N=4, 8, 16 or 32.

8. An encoder according to claim 1 further adapted to reproduce auxiliary coded data elements which are linear combinations of the state data elements and the primary coded data elements.

9. A composite code encoder comprising the encoder of claim 1, the composite code encoder being further adapted to applying a second set of constraints such that a re-ordered version of the sequence of primary coded data elements satisfies the second set of constraints simultaneous with the sequence of primary coded data elements satisfying the first set of constraints.

10. A composite code encoder according to claim 9 wherein the second set of constraints is equivalent to the first set of constraints.

11. A composite code encoder according to claim 9 further adapted to produce auxiliary coded data elements which are linear combinations of the state data elements and the primary coded data elements.

12. An encoder adapted to encode a sequence of source data elements to produce a sequence of primary coded data elements, the encoder comprising a data insertion component and a linear state sequencer having state data elements, wherein:

the data insertion component is adapted to receive the sequence of source data elements and to output the sequence of primary coded data elements which includes every data element of the sequence of source data elements and which on an ongoing basis includes inserted data elements, each inserted data element having a linear dependence on the state data elements;

the linear state sequencer is adapted to perform linear state sequencing as a function of the sequence of primary coded data elements which is provided as input to the linear state sequencer and as a function of the state data elements; and inserted data element insertion by the data insertion component into the sequence of source data elements to produce the sequence of primary coded elements does not render unreachable any particular set of values for the state data elements of the linear state sequencer.

13. An encoder adapted to encode a sequence of source data elements to produce a sequence of primary coded data elements which satisfy a first set of constraints, the first set of constraints being equivalent to a set of constraints implemented by another encoder, the another encoder comprising a data insertion component and a linear state sequencer having state data elements, wherein;

data insertion component is adapted to receive the sequence of source data elements and to output the sequence of coded data elements which includes every data element of the sequence of source data elements and which on an ongoing basis includes inserted data elements, each inserted data element having linear dependence on the state data elements;

the linear state sequencer is adapted to perform linear state sequencing as a function of the sequence of primary coded data elements which is provided as input to the linear state sequencer and as a function of the state data elements; and inserted data element insertion by the data insertion component into the sequence of source data elements to produce the sequence of primary coded elements does not render unreachable any particular set of values for the state data elements of the linear state sequencer.

14. A soft-in soft-out decoder adapted to perform soft-in soft-out decoding in a manner consistent with an encoder adapted to encode a sequence of source data elements to produce a sequence of primary coded data elements satisfying a first set of constraints, the first set of constraints being equivalent to a set of constraints implemented by another encoder, the another encoder comprising a data organization component, a linear state sequencer and a state-to-data-elements converter, wherein:

the data organization component is adapted to receive the sequence of source data elements and to receive a sequence of state-derived data elements from the state-to-data-elements converter and to output a data organization output sequence which includes every data element of the sequence of source data elements and which on an ongoing basis includes inserted data elements, each inserted data element being a state-derived data element output by the state-to-data-elements converter;

the linear state sequencer being adapted to maintain a state consisting of state data elements and to perform linear state sequencing as a function of the data organization output sequence, which is provided as input to the linear state sequencer, and as a function of the state data elements;

the state-to-data-elements converter being adapted to produce said sequence of state-derived data elements, wherein each state-derived data element is a linear combination of the state data elements;

wherein the linear state sequencer is configured to satisfy the following specifications:

a) if the linear state sequencer state is zero at a time i, any non-zero data organization output sequence data element at time i will result in a non-zero state at time i+1;

b) if the linear state sequencer state is zero at a time i, non-zero at time i+1; but again zero at a later time k>i+1, then necessarily there must be a non-zero data organization output sequence data element at some time j, with i<j<k;

and wherein the data organization component and the state-to-data-elements converter are configured in relation to the linear state sequencer to satisfy the following specifications:

c) if the linear state sequencer state is non-zero at a time x, non-zero at a later time z>x, and non-zero for all times between x and z, the time z cannot be advanced indefinitely, in so doing increasing the duration of the time interval [x,z] during which the linear state sequencer state is always non-zero, without necessitating a non-zero data organization output sequence data element at some time y, with x≦y<z;

d) data element insertion by the data organization component into the sequence of source data elements to produce the data organization output sequence does not render any linear state sequencer state unreachable;

the sequence of primary coded data elements being equal to the data organization output sequence;

the soft-in soft-out decoder decoding a first sequence of multi-valued probabilistic quantities to produce a second sequence of multi-valued probabilistic quantities, wherein the decoder is adapted to consider all linear state sequencer state transitions for state transition intervals without inserted data elements, and is adapted to consider for state transition intervals with inserted data elements only state transitions which are possible given that the inserted data elements have a predetermined dependency on the state.

15. An iterative decoder adapted to perform iterative decoding of a sequence of multi-valued probabilistic quantities to produce a sequence of decoded data elements, the iterative decoder comprising a soft-in soft-out decoder according to claim 14.

16. A soft-in soft-out decoder adapted to perform so-in soft-out decoding in a manner consistent with an encoder adapted to encode a sequence of source data elements to produce a sequence of primary coded data elements, the encoder comprising a data insertion component and a linear state sequencer having state data elements, wherein:

the data insertion component is adapted to receive the sequence of source data elements and to output the sequence of primary coded data elements which includes every data element of the sequence of source data elements and which on an ongoing basis includes inserted data elements, each inserted data element having a linear dependence on the state data elements;

the linear state sequencer is adapted to perform linear state sequencing as a function of the sequence of primary coded data elements which is provided as input to the linear state sequencer and as a function of the state data elements; and inserted data element insertion by the data insertion component into the sequence of source data elements to produce the sequence of primary coded elements does not render unreachable any particular set of values for the state data elements of the line state sequencer;

the soft-in soft-out decoder decoding a first sequence of multi-valued probabilistic quantities to produce a second sequence of multi-valued probabilistic quantities, wherein the decoder is adapted to consider all linear state sequencer state transitions for state transition intervals without inserted data elements, and is adapted to consider for state transition intervals with inserted data elements only state transitions which are possible given the inserted data elements have a predetermined dependency on the state.

17. An iterative decoder adapted to perform iterative decoding of a sequence of multi-valued probabilistic quantities to produce a sequence of decoded data elements, the iterative decoder comprising a soft-in soft-out decoder according to claim 16.

18. A signal comprising a sequence of primary coded data elements of a first code embodied on a transmission medium or a storage medium containing every data element from a sequence of source data elements, the sequence of primary coded data elements also containing on an ongoing basis inserted data elements, the inserted data elements having a linear dependence upon a state, the state being determined by performing linear state sequencing as a function of the sequence of primary data elements which is provided as input the linear state sequencing wherein the sequence of primary coded data elements satisfies the following specifications:

a) if the linear state sequencing state is zero at a time i, any non-zero data element of the sequence of primary coded data elements at time i will result in non-zero state at time i+1;

b) if the linear state sequencing state is zero at a time i, non zero at time i+1, but again zero at a later time k>i+1, then necessarily there must be a non-zero data element of the sequence of primary coded data elements at some time j, with i<j<k;

c) if the State of the linear state sequencing is non-zero at a time x, non-zero at a later time z>x, and non-zero for all times between x and z, the time z cannot be advanced indefinitely, in so doing increasing the duration of the time interval [x,z] during which the linear state sequencing state is always non-zero, without necessitating a non-zero data element of the sequence of primary coded data elements at some time y, with x≦y<z; and d) data element insertion into the sequence of source data elements to produce the sequence of primary coded data elements does not render any line state sequencing states unreachable.

19. A soft-in soft-out decoder adapted to perform soft-in soft-out decoding, in accordance with a set of constraints satisfied by the sequence of primary coded data elements of claim 18, of multi-valued probabilistic quantities representing said source data elements coded to satisfy said set of constraints, to produce a second sequence of multi-valued probabilistic quantities, wherein the decoder is adapted to consider all linear state sequencing state transitions for state transition intervals without inserted data elements, and is adapted to consider for state transition intervals with inserted data elements only state transitions which are possible given that the inserted data elements have a predetermined dependency on the state.

20. A signal according to claim 18 wherein the sequence of primary coded data elements is further adapted to, after being reordered, satisfy a set of constraints imposed by a second code.

21. A signal according to claim 20 wherein the set of constraints imposed by the second code is equivalent to the set of constraints imposed by the first code.

22. A decoder adapted to iteratively decode quantities representative of a signal according to claim 20.

23. A signal according to claim 20 wherein the set of constraints imposed by the second code is equivalent to a set of constraints imposed by another first code according to claim 20.

24. A decoder adapted to iteratively decode quantities representative of a signal according to claim 23.

25. A decoder according to claim 24 adapted to repeatedly, alternating between SISO decoding the first and second code, SISO decode one of the codes taking into account intrinsic information associated with the sequence of primary coded data elements associated with the one of the codes and taking into account extrinsic information generated by previously SISO decoding the other of the codes, to produce extrinsic information to be made available when next SISO decoding the other of the codes.

26. A method of stopping an iterative decoder decoding a composite code comprising at least two constituent codes, a partial iteration of the iterative decoder comprising performing SISO decoding of one of the constituent codes, the method comprising:

checking three conditions as follows for each multiple instance data element:

a) after each partial iteration a change in an extrinsic associated with each instance of a data element, not including a next instance to undergo SISO processing, must not disagree with a decision associated with this same instance;

b) decisions must agree between all instances of a data element;

c) decisions must be unambiguous;

and when the three conditions are satisfied, stopping the iterative decoder from performing any further partial iterations.

27. A method according to claim 26 adapted for application therein said at least two constituent codes comprise two constituent codes.

28. A processing platform readable medium having stored thereon code means executable by a processing platform, the code means when executed being adapted to encode a sequence of source data elements to produce a sequence of primary coded data elements according to a first code, the code means comprising functionality equivalent to a data organization component, a linear state sequencer and a state-to-data-elements converter, wherein:

the data organization component is adapted to receive the sequence of source data elements and to receive a sequence of state-derived data elements from the state-to-data-elements converter to output a data organization output sequence which includes every data element of the sequence of source data elements and which on an ongoing basis includes inserted data elements, each inserted data element inserted at a given time instant being either: i) one state-derived data element being output by the state-to-data elements converter at the given time instant or ii) a sum of one state-derived data element being output by the state-to-data elements converter at the given time instant and a linear combination of source data elements being output by the data organization component at the given time instant;

the linear state sequencer being adapted to maintain a state consisting of state data elements and to perform linear state sequencing as a function of the data organization output sequence, which is provided as input to the linear state sequencer, and as a function of the state data elements;

the state-to-data-elements converter being adapted to produce said sequence of state-derived data elements, wherein each state-derived data element is a linear combination of the state data elements;

and wherein the data organization component and the state-to-data-elements converter are configured in relation to the linear state sequencer such that data element insertion by the data organization component into the sequence of source data elements produce the data organization output sequence does not render any linear state sequencer state unreachable;

the sequence of primary coded data elements being equal to the data organization output sequence;

wherein the sequence of primary coded data elements after being reordered also satisfies a second set of constraints equivalent to a second code.

29. A processing platform readable medium according to claim 28 wherein the constraints of the second code are equivalent to those of the first code.

30. A processing platform readable medium according to claim 28 wherein the state sequencer is an N state sequencer with N=4, 8, 16 or 32.

31. A processing platform readable medium having stored thereon code means executable by a processing platform, the code means when executed being adapted to perform iterative decoding in a manner consistent with an encoder adapted to encode a sequence of source data elements to produce a sequence of primary coded data elements according to a first code, the encoder comprising data organization component, a linear state sequencer and a state-to-data-elements converter, wherein:

the data organization component is adapted to receive the sequence of source data elements and to receive a sequence of state-derived data elements from the state-to-data-elements converter and to output a data organization output sequence which includes every data element of the sequence of source data elements and which on an ongoing basis include inserted data elements, each inserted data element being a state-derived data element output by the state-to-data elements converter;

the linear state sequencer being adapted to maintain a state consisting of state data elements and to perform linear state sequencing as a function of the data organization output sequence, which is provided as input to the linear state sequencer, and as a function of the state data elements;

the state-to-data-elements converter being adapted to produce a said sequence of state-derived data elements, wherein each state-derived data element is a linear combination of the state data elements;

and wherein the data organization component and the state-to-data-elements converter are configured in relation to the linear state sequencer such that data element insertion by the data organization component into the sequence of source data elements to produce the data organization output sequence does not render any linear state sequencer state unreachable;

the sequence of primary coded data elements being equal to the data organization output sequence;

and wherein the sequence of primary coded data elements after being reordered also satisfies a second set of constraints equivalent to a second code;

the code means when executed being adapted to repeatedly alternate between SISO decoding the first and second code, SISO decode one of the codes taking into account intrinsic information associated with the sequence of primary coded data elements associated with the one of the codes and taking into account extrinsic information generated by previously SISO decoding the other of the codes, to produce extrinsic information to be made available when next SISO decoding the other of the codes.

32. A processing platform readable medium having stored thereon code means executable by a processing platform, the code means when executed being adapted to perform soft-in soft-out decoding in a manner consistent with an encoder adapted to encode a sequence of source data elements to produce a sequence of primary coded data elements, the encoder comprising a data insertion component and a linear state sequencer having state data elements, wherein:

the data insertion component is adapted to receive the sequence of source data elements and to output the sequence of primary coded data elements which includes every data element of the sequence of source data elements and which on an ongoing basis includes inserted data elements, each inserted data element having a linear dependence on the state data elements;

the linear state sequencer is adapted to perform linear state sequencing as a function of the sequence of primary coded data elements which is provided as input to the linear state sequencer and as a function of the state data elements; and inserted data element insertion by the data insertion component into the sequence of source data elements to produce the sequence of primary coded elements does not render unreachable any particular set of values for the state data elements of the linear state sequencer;

the encoder performing soft-in soft-out decoding of a first sequence of multi-valued probabilistic quantities to produce a second sequence of multi-valued probabilistic quantities, wherein the code means is adapted to consider all linear state sequencer state transitions for state transition intervals without inserted data elements, and is adapted to consider for state transition intervals with inserted data elements only state transitions which are possible given that the inserted data elements have a predetermined dependency on the state.

* * * * *

UNITED STATES PATENT AND TRADEMARK OFFICE
CERTIFICATE OF CORRECTION

PATENT NO. : 6,944,803 B2
APPLICATION NO. : 09/899150
DATED : September 13, 2005
INVENTOR(S) : Andrew William Hunt It is certified that error appears in the above-identified patent and that said Letters Patent is hereby corrected as shown below:

Column 28,
Line 44, "...stat..." should be -- ...state... --.
Line 67, "...state time..." should be -- ...state at time... --.

Column 29,
Line 2, "...bat..." should be -- ...but... --.
Line 31, "...version of sequence of..." should be -- ...version of the sequence primary coded data elements;... --.
Line 37, "...claim 1;..." should be -- ...claim 1,... --.
Line 56, "...constraint..." should be -- ...constraints... --.
Line 63, "...reproduce..." should be -- ...produce... --.
Line 66, "...on-zero..." should be -- ...on-zero... --.

Column 30,
Line 1, "...applying..." should be -- ...apply... --.
Line 41, "...data insertion..." should be -- ...the data insertion... --.
Line 43, "...sequence of coded..." should be -- ...sequence of primary coded... --.

Column 31,
Line 27, "...i + 1;..." should be -- ...i + 1,... --.
Line 30, "...time i..." should be -- ...time j... --.
Line 66, "...so-in..." should be -- ...soft-in... --.

Column 32,
Line 21, "...line..." should be -- ...linear... --.
Line 59, "...State..." should be -- ...state... --.

Column 33,
Line 62, "...therein..." should be -- ...wherein... --.

UNITED STATES PATENT AND TRADEMARK OFFICE
CERTIFICATE OF CORRECTION

PATENT NO. : 6,944,803 B2
APPLICATION NO. : 09/899150
DATED : September 13, 2005
INVENTOR(S) : Andrew William Hunt It is certified that error appears in the above-identified patent and that said Letters Patent is hereby corrected as shown below:

<u>Column 34,</u>
Line 34, "...elements produce..." should be -- ...elements to produce... --.
Line 64, "...include..." should be -- ...includes... --.

Signed and Sealed this

Fourth Day of July, 2006

JON W. DUDAS
*Director of the United States Patent and Trademark Office*